United States Patent [19]

Randhawa et al.

[11] Patent Number: 5,234,561
[45] Date of Patent: Aug. 10, 1993

[54] PHYSICAL VAPOR DEPOSITION DUAL COATING PROCESS

[75] Inventors: Harbhajan S. Randhawa; Jeffrey M. Buske, both of Boulder, Colo.

[73] Assignee: Hauzer Industries bv, Venlo, Netherlands

[21] Appl. No.: 236,648

[22] Filed: Aug. 25, 1988

[51] Int. Cl.⁵ .................. C23C 14/34; C23C 14/32
[52] U.S. Cl. ...................... 204/192.38; 204/192.12; 204/192.13; 204/192.16; 204/192.27; 204/298.03; 204/298.26; 204/298.41
[58] Field of Search .......... 204/192.12, 192.13, 204/192.15, 192.16, 192.27, 192.38, 298 MT, 298 CS, 298 MS, 298 PM, 298 MC, 298 MD, 298 D, 298.03, 298.09, 298.11, 298.25, 298.26, 298.41; 427/37

[56] References Cited

U.S. PATENT DOCUMENTS

| | | | |
|---|---|---|---|
| 3,625,848 | 12/1968 | Snaper | 204/192.38 |
| 3,836,451 | 9/1974 | Snaper | 204/298 |
| 4,162,954 | 7/1979 | Morrison | 204/298 |
| 4,180,450 | 12/1979 | Morrison | 204/298 |
| 4,234,622 | 11/1980 | DuBuske et al. | 427/45.1 |
| 4,415,421 | 6/1983 | Sasunuma | 204/192.31 |
| 4,430,184 | 7/1984 | Mularie | 204/192.38 |
| 4,448,802 | 5/1984 | Buhl | 427/42 |
| 4,500,408 | 2/1985 | Boys et al. | 204/298 |
| 4,560,462 | 12/1985 | Radford et al. | 204/298 |
| 4,591,418 | 5/1986 | Snyder | 204/192.16 |
| 4,648,952 | 3/1987 | Savov et al. | 204/192.12 |
| 4,707,238 | 11/1987 | Okubo | 204/192.38 |
| 4,715,319 | 12/1987 | Bringmann | 118/723 |
| 4,724,058 | 2/1988 | Morrison | 204/192.38 |
| 4,877,505 | 10/1989 | Bergmann | 204/192.38 |

FOREIGN PATENT DOCUMENTS

0306612 4/1988 European Pat. Off. ........ 204/192.38

OTHER PUBLICATIONS

Technical Note: A Review of Cathodic Arc Plasma Deposition Processes and Their Applications, *Surface and Coating Technology*, vol. 31, 303–318 (1987).

Primary Examiner—Aaron Weisstuch
Attorney, Agent, or Firm—Beaton & Swanson

[57] ABSTRACT

A machine for covering a substrate (FIG. 14, 540) by means of both cathodic arc plasma deposition (CAPD) (FIG. 2) and magnetron sputtering (FIG. 1) without breaking vacuum in a single chamber (FIG. 14, 421). A computer system monitors (FIG. 3, 403, 405) and controls all coating process parameters to coat in any sequence multiple thin film layers using either the CAPD or magnetron sputtering process. A rotating substrate table (FIG. 14, 470) used in conjunction with internal and external targets coats both sides of the substrate simultaneously.

6 Claims, 20 Drawing Sheets

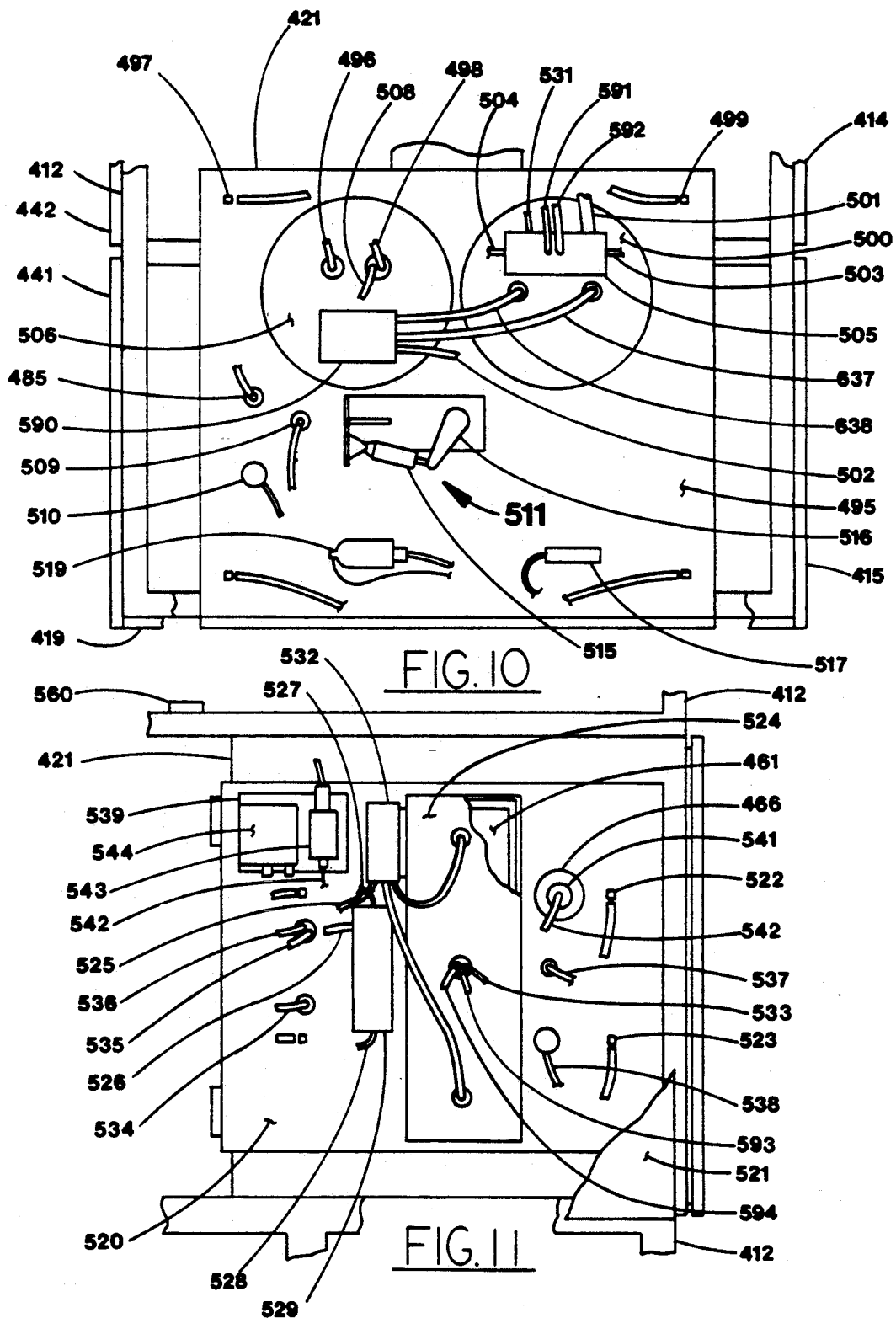

| S.No. | COMPOSITION | RANGE | | |
|---|---|---|---|---|
| | | $L^*$ | $a^*$ | $b^*$ |
| 1 | TiN | 77-80 | 2-5 | 33-37 |
| 2 | $TiC_{0.05}N_{0.95}$ | 76-79 | 5.5-8 | 30-33 |
| 3 | $TiC_{0.10}N_{0.90}$ | 71-75 | 8.5-11 | 23-28 |
| 4 | $TiC_{0.15}N_{0.85}$ | 66-69 | 11-16 | 21-22 |
| 5 | ZrN | 86-89 | -3--1 | 23-25 |
| 6 | $ZrC_{0.10}N_{0.90}$ | 81-84 | -1--0.4 | 26-29 |
| 7 | $ZrC_{0.15}N_{0.85}$ | 79-81 | 0-3 | 17-19 |
| 8 | Gold 10K | 81-86 | -1.6-1 | 19-30 |
| 9 | Gold 24K (Pure) | 88-91 | -3.7-1 | 27-34 |

FIG. 22

PHYSICAL VAPOR DEPOSITION DUAL COATING PROCESS

FIELD OF THE INVENTION

The present invention relates to vacuum coating production system utilizing both cathodic arc emission and magnetron sputtering processes.

BACKGROUND OF THE INVENTION

Sputtering Processes

Over the past 30 years or so there have been numerous reviews of sputtering and sputtering processes for film deposition.

Because there are so many interactions among parameters in sputtering systems, it is impossible to separate them completely.

Typically, the target (a plate of the material to be deposited or the material from which a film is to be synthesized) is connected to a negative DC voltage supply (or an RF power supply). The substrate is the material to be coated and it faces the target. The substrate may be grounded, floating, biased, heated, cooled, or some combination of these. A gas is introduced to provide a medium in which a glow discharge can be initiated and maintained. Gas pressures ranging from a few millitorr to several tens of millitorr are used. The most common sputtering gas is argon.

When the glow discharge is started, positive ions strike the target plate and remove mainly neutral target atoms by momentum transfer, and these condense on the substrate to form thin films. There are, in addition, other particles and radiation produced at the target, all of which may affect film properties (secondary electrons and ions, desorbed gases, X-rays, and photons). The electrons and negative ions are accelerated toward the substrate platform and bombard it and the growing film. In some instances, a bias potential (usually negative) is applied to the substrate holder, so that the growing film is subject to positive ion bombardment. This is known variously as bias sputtering or ion plating.

In some cases, gases or gas mixtures other than Ar are used. Usually this involves some sort of reactive sputtering process in which a compound is synthesized by sputtering a metal target (e.g., Ti) in a reactive gas (e.g., $O_2$ or $Ar-O_2$ mixtures) to form a compound of the metal and the reactive gas species (e.g., $TiO_2$).

Emission of Neutral Particles-The Sputtering Yield

The sputtering yield is defined as the number of atoms ejected from a target surface per incident ion. It is the most fundamental parameter of sputtering processes. Yet all of the surface interaction phenomena involved that contribute to the yield of a given surface are not completely understood. Despite this, an impressive body of literature exists showing the yield to be related to momentum transfer from energetic particles to target surface atoms.

It is estimated that 1% of the energy incident on a target surface goes into ejection of sputtered particles, 75% into heating of the target and the remainder is dissipated by secondary electrons that bombard and heat the substrates. An improved process called magnetron sputtering uses magnetic fields to conduct electrons away from the substrate surface thereby reducing the heat.

There are three basic effects that occur at a substrate during glow discharge sputtering: (1) condensation of energetic vapor, (2) heating, and (3) bombardment by a variety of energetic species. The sum of all of these effects must be carefully controlled, and, since they are all interdependent, this is sometimes difficult.

For a given target material both deposition rate and uniformity are influenced by system geometry, target voltage, sputtering gas, gas pressure, and power. All other things being equal, rates are linearly proportional to power and decrease with increasing target-substrate separation. The sputtering gas influences deposition rate in the same way as it affects sputtering yields. As the gas pressure is increased the discharge current increases (increasing rate), but return of material to the target by backscattering also increases (decreasing rate). This is further complicated in some cases by increased Penning ionization at higher pressures which increases the rate by self-sputtering. The sum of all of this leads to gas pressure or a small range of gas pressure at which the rate is a maximum, and this must be determined empirically for each application. The optimum pressure may be anywhere between a few mTorr and several tens of mTorr.

In general, for a given gas pressure there will be an optimum target-substrate separation to produce the best uniformity. For small targets (15-cm diameter) this separation is generally small (a few centimeters), while for larger targets, the optimum separation may be considerably larger (10-20 cm).

Unquestionably, the hallmark of the sputtering processes described is versatility, both in terms of materials that can be deposited and process parameters that can be adjusted to tailor the properties of thin films as desired. However, the sheer number of critical process parameters and their complex interrelationships can often make these processes difficult to control. In general, these processes are found to be most useful in applications requiring rather thin films (generally 1 micron because of relatively low deposition rates) and/or in cases where the desired material simply cannot be deposited stoichiometrically any other way.

The above portion of this patent application was reprinted with permission from the publishers of *Thin Film Processes*, edited by John L. Vossen and Werner Kern (copyright Academic Press, Inc., New York, 1978, pp. 12-62).

Cathodic Arc Plasma Deposition

In the past ten years major advancements have been made in a related physical deposition process called cathodic arc plasma deposition (CAPD).

In the CAPD process target material is evaporated by the action of vacuum arcs. The target source material is the cathode in the arc circuit. The basic components of a CAPD system consist of a vacuum chamber, a cathode and an arc power supply, a means of igniting an arc on the cathode surface, an anode, a substrate and a substrate bias power supply. Arcs are sustained by voltages typically in the range of 15-50 V, depending on the target cathodic material employed. Typical arc currents in the range of 30-400 A are employed. Arcing is initiated by the application of a high voltage pulse to an electrode placed near the cathode (gas discharge ignition) and/or by mechanical ignition. The evaporation occurs as a result of the cathodic arc spots which move randomly on the surface of the cathode at speeds typically of the order of $10^2$ m/s. The arc spot motion can also be controlled with the help of appropriate confinement boundaries and/or magnetic fields. The arc spots are sustained owing to material plasma generated with the arc itself. The target cathodic material can be a metal, a semiconductor or an insulator.

The CAPD process is a unique process and is markedly different from other physical vapor deposition (PVD) processes. Some of the characteristic features of the CAPD process are as follows.

(i) The core of the CAPD process is the arc spot which generates material plasma.

(ii) A high percentage (30%–100%) of the material evaporated from the cathode surface is ionized.

(iii) The ions exist in multiple charge states in the plasma, e.g. Ti, $Ti^+$, $Ti^{+2}$ and $Ti^{+3}$ etc.

(iv) The kinetic energies of the ions are typically in the range 10–100 eV.

These features result in deposits that are of superior quality compared with those from other physical vapor deposition processes. Some of these advantages are as follows.

(a) Good quality films over a wide range of deposition conditions, e.g. stoichiometric compound films with superior adhesion and high density, can be obtained over a wide range of reactive gas pressure and metal/refractory evaporation rates.

(b) High deposition rates for metals, alloys and compounds with excellent coating uniformity.

(c) Low substrate temperatures.

(d) Retention of alloy composition from source to deposits.

(e) Ease in deposition of compound films.

Cathodic Arc Emission Characteristics

The cathodic arc results in a plasma discharge within the material vapor released from the cathode surface. The arc spot is typically a few micrometers in size and carries current densities as high as 10 amps per square micrometer. This high current density causes flash evaporation of the source material and the resulting evaporant consists of electrons, ions, neutral vapor atoms and microdroplets. The electrons are accelerated toward the cloud of positive ions. The emissions from the cathode spots are relatively constant over a wide range of arc current as the cathode spots split into a number of spots. The average current carried per spot depends on the nature of the cathode material.

It is likely that almost 100% of the material may be ionized within the cathode spot region. These ions are ejected in a direction almost perpendicular to the cathode surface. The microdroplets, however, have been postulated to leave the cathode surface at angles up to about 30° above the cathode plane. The microdroplet emission is a result of extreme temperatures and forces that are present within emission craters.

The cathodic arc plasma deposition process was considered unsuitable for decorative applications until recently, due to the presence of microdroplets in the film.

Latest developments involving elimination of microdroplets in the CAPD process has provided a significant alternative to existing techniques for a wide range of decorative applications. The CAPD process offers additional flexibility in the following areas:

(i) The control of deposition parameters is less stringent than magnetron sputtering or ion plating processes.

(ii) The deposition temperature for compound films can be adjusted to much lower temperatures thus allowing the ability to coat substrates such as zinc castings, brass and even plastics without melting the substrate.

In summary, the CAPD process offers many advantages over the traditional sputtering process noted above. However, certain decorative applications requiring a thin film are best accomplished with a sputtering process. One such application is applying a thin coating of gold on jewelry.

This is due to the difficulty of eliminating microdroplets in gold, copper, and silver coatings in CAPD processes. Therefore, sputtering is the preferred method today for depositing a thin gold coating for decorative purposes.

Gold, however, is relatively soft. Under conditions of continuous use it develops a diffusely reflecting appearance and is simultaneously worn away. See U.S. Pat. No. 4,591,418 (1986) to Snyder. A coating of titanium nitride (TiN) using the improved CAPD process as disclosed in U.S. patent application Ser. No. 07/025,207 to Randhawa, incorporated herein by reference, creates excellent color matching to gold. Thus, it is possible to deposit titanium nitride on an inexpensive jewelry piece with Randhawa's improved CAPD process and then deposit real gold over the titanium nitride. Jewelry with this unique two layer coating offers the user a real gold plated piece plus a piece with the extremely wear resistant titanium nitride undercoat. Thus, if the real gold layer partially wears away, then the color matched titanium nitride retains the look of real gold in the worn away portion of the piece.

A difficulty in sequential layers of gold and TiN is that gold and TiN adhere very poorly to one another. Until the present invention, it is believed that only two basic methods were known to create multiple gold and TiN coatings. The first method is taught by Snyder, supra, which uses at least four interleaved layers of gold and TiN. The second method is taught by U.S. Pat. No. 4,415,421 (1983) to Sasanuma. Sasanuma teaches simultaneous sputtering by means of an electron beam three different layers. Sasanuma attempts to overcome the poor adhesion between gold and TiN by including an intermediary layer of TiN and gold between the bottom layer of TiN and the top layer of gold.

The present invention overcomes these difficulties and provides a convenient single system to enable the direct coating of gold over TiN without adhesion problems. The present invention includes an advanced CAPD process and a modern magnetron sputtering process in a single machine.

SUMMARY OF THE INVENTION

It is, therefore, the object of the present invention to provide a machine capable of sequentially producing a coating using the CAPD process and the magnetron sputtering process.

Another object of the present invention is to provide the machine with a computer controlled sequencing system.

Another object of the present invention is to provide the machine with a common substrate turntable for both processes.

Another object of the present invention is to provide the machine with the capability to coat both sides of a workpiece simultaneously with one process and then the other process.

Another object of the present invention is to provide the machine with a computer controlled reactant gas subsystem which can mix various gases with either process.

Another object of the present invention is to provide the machine with a variable substrate bias voltage for enhanced process control.

Another object of the present invention is to provide the machine with a common vacuum pumping system for both processes.

Another object of the present invention is to provide the machine with a common cooling system for both processes.

Another object of the present invention is to provide a system which allows pure gold to firmly adhere to a coating of a nitride or a carbonitride.

Another object of the present invention is to provide a system which allows pure gold to firmly adhere to a nitride or a carbonitride or a suitably hardened substrate.

Another object of the present invention is to provide a system which can simultaneously coat a substrate using a CAPD process and a magnetron sputtering process.

Other objects of this invention will appear from the following description and appended claims, reference being made to the accompanying drawings forming a part of this specification wherein like reference characters designate corresponding parts in the several views.

Certain terms used herein are defined below:

Crossover setpoint: A defined pressure in the vacuum chamber where rough pumping ceases and diffusion pump and cold trap pumping take over to reduce pressure to high vacuum.

Hi-vac: A short-hand expression for high vacuum.

MilliTorr: One thousandth of a Torr. See below.

Substrate: Refers to the objects being coated.

Torr: A unit of pressure; that pressure necessary to support a column of mercury one millimeter high at zero degrees Celsius and standard gravity.

Plasma: A collection of charged particles containing equal numbers of positive ions and electrons and which is a good conductor of electricity and is affected by a magnetic field.

The basic magnetron sputtering process is disclosed in *Thin Film Processes*, supra. Improvements are disclosed in U.S. Pat. Nos. 4,162,954 (1979) and 4,180,450 (1979) to Morrison, Jr. and assigned to the assignee of the present invention, Vac-Tec Systems, Inc. All these references are hereby incorporated herein by reference.

The basic CAPD process has evolved over the past twenty years. U.S. Pat. Nos. 3,625,848 (1971) and 3,836,451 (1974) to Snaper and assigned to Vac-Tec Systems, Inc. provide the origins of the basic process. U.S. Pat. Nos. 4,430,184 (1984) to Mularie and 4,724,058 (1988) to Morrison, Jr., both assigned to Vac-Tec Systems, Inc., provide improvements to the basic CAPD process. A summary of the CAPD art is provided in "Technical Note: A Review of Cathodic Arc Plasma Deposition Processes And Their Applications" by H. Randhawa and P. C. Johnson (*Surface and Coatings Technology*, 31 (1987 pp. 303-318). Further improvements to CAPD processing are disclosed in U.S. patent application Ser. No. 07/025,207 to Randhawa and assigned to Vac-Tec Systems, Inc. All the above references are hereby incorporated by reference herein.

The present invention is a production CAPD and sputter coating system designed to deposit high performance metallurgical coatings onto a wide variety of substrates. It employs CAPD targets and sputter targets to deposit thin films of material onto substrates in a vacuum environment.

The sputter deposition process, using cathodes, is a relatively high voltage, low amperage process adaptable to depositing virtually any material. The process bombards the target material with positive ions, dislodging mainly neutral target atoms by momentum transfer. The dislodged atoms condense into thin films on the substrates.

The CAPD process uses a relatively high amperage and low voltage to evaporate an electrically conductive target source material and condense it onto the substrates to form a coating.

The preferred embodiment of the present invention employs two 5×24 inch (12.7×60.96 cm) CAPD targets and two 3.5×25 inch (8.89×93.5 cm) sputter targets to generate materials to be deposited.

A substrate fixture bearing the substrates rotates in the chamber. Alternatively, the substrate may be variably passed in front of the targets by means of planetary motion, oscillation, or reciprocation. A potentiometer or variable controller varies the speed of rotation according to the requirements of the deposition process.

DC bias power can be applied to the substrate fixture and substrates, during the deposition process, to enhance the movement of the target atoms toward the substrates and/or to effect the characteristics of the depositing film.

A diffusion pump, polycold trap (Meissner Trap), a cryogenic pump, or a turbomolecular pump create and maintain high vacuum in the chamber during the process. A mechanical pump evacuates the chamber to low vacuum (rough vacuum) and pumps (draws the exhaust away from) the diffusion pump or turbomolecular pump during high vacuum pumping.

A programmable logic controller (PLC) manages the process sequences. The system responds to the feedback of relevant processing parameters. Manual override is always available.

The major components of the present invention are:
1. the system main frame which supports and surrounds the processing chamber,
   the diffusion pump and polycold trap,
   water and compressed air distribution panels,
   mass flow controllers and valves for process gasses,
   monitoring instruments, and
   electrical terminal board.
2. the system control console containing the control instruments,
3. two CAPD target power supplies,
4. the mechanical pump,
5. the compressor for the polycold trap,
6. a power supply cabinet containing the power supplies for the targets and bias,
7. the power distribution cabinet and transformer,
8. the programmable logic controller (PLC)
9. computer,
10. the software for the computer, and
11. the software for the PLC.

A Typical CAPD Process Cycle

The operator loads the fixture with substrates and closes the front chamber door, sealing the chamber. The mechanical pump reduces pressure in the chamber to the crossover setpoint, typically set between 80 and 150 milliTorr.

The chamber roughing valve closes when the chamber reaches the crossover setpoint; the hi-vac valve opens a few seconds later. The closing of the chamber roughing valve isolates the mechanical pump from the chamber; the opening of the hi-vac exposes the chamber to the diffusion pump and polycold trap.

The pump-down cycle ends when the diffusion pump reduces pressure in the chamber to a preset level, referred to as the base pressure and typically $2 \times 10^{-5}$ Torr. The drive motor then begins to rotate the substrate fixture.

The reduction of pressure to $2 \times 10^{-5}$ Torr removes from the chamber most of the gas and water molecules which would otherwise interfere with the process.

Typically, nitrogen flows into the chamber, raising the pressure to $1 \times 10^{-3}$ Torr or higher. The CAPD arc is then initiated. A high bias current initiates the cleaning cycle to clean the substrates with the sputtering action of ionized particles.

The high bias cycle ends and the deposition cycle begins. Nitrogen gas back fills the chamber to operating pressure—a pressure between 5 and $20 \times 10^{-3}$ Torr.

Typically, nitrogen molecules combine with molecules of the CAPD target (i.e. titanium) during the reactive deposition process to form a coating of titanium nitride on the substrates; thus, the process consumes a portion of the nitrogen introduced into the chamber.

Nitrogen flows continuously into the chamber during the deposition process, requiring constant pumping by the high vacuum pump. The system balances the flow rate of the nitrogen with the pumping rate to keep pressure in the chamber at its operating pressure setpoint.

The system adjusts the flow rate of nitrogen with a mass flow controller, which compensates for the effect of pressure on the density of nitrogen and delivers standard volumes of gas regardless of pressure.

A negative voltage at the substrate accelerates the positively-charged ions of titanium en route from the targets. The negative voltage is called the bias voltage and is typically in the range of $-50$ to $-500$ volts of direct current (VDC).

The titanium targets are consumed during the deposition process and must be replaced periodically.

CAPD targets are connected to the negative output of the arc power supplies. Current flows from the arc targets through a plasma to an anode. Positively ionized particles of titanium, stripped from the target by the current, flow toward the negatively charged substrate, combining with nitrogen on the surface of the substrate to form the coating.

The PLC shuts off the nitrogen and power to the CAPD target sources at the conclusion of the deposition process and vents the chamber with nitrogen. When the chamber reaches atmospheric pressure, the PLC activates an audible signal.

Sputtering

Sputtering is a relatively high voltage, low amperage, deposition process in contrast with a CAPD deposition process which employs relatively high amperages and low voltages.

Positive ions, generated in the glow discharge of the plasma, strike the target on the cathode and dislodge mainly neutral target atoms by momentum transfer.

The bombardment causes the target material to vaporize. Atoms dislodged from the targets condense into thin films on the substrate.

The targets in the preferred embodiment measure 3.5 by 25 inches and are cooled by water.

Magnetron cathodes trap the plasma in a process chamber close to the target material by crossing electrical and magnetic fields. The eroding action of the plasma on the targets yields a high sputtering rate per watt of power.

The preferred embodiment of the present invention uses water cooled cathodes.

The operator may select from the following parameters from the PLC for a sputtering deposition cycle:
Sputter process time,
Cathode #1 power setpoint,
Cathode #2 power setpoint, and
Sputter gas pressure The operator selects the gas from the system control panel. Argon is the preferred gas for the sputtering deposition process because of its mass.

The sputtering deposition cycle may also be automated If the chamber is at base pressure, then the operator initiates the automated process by:
1. Switching to SPUTTER from CAPD at the deposition select panel.
2. Entering the sputter parameters at the PLC.
3. Pressing process START on the system control panel.
4. Adding bias power if desired.

The completion of the above noted CAPD and sputter process in the present invention will produce brilliant gold plated jewelry or a variety of other coatings on any substrate.

BRIEF DESCRIPTION OF THE DRAWINGS

FIG. 10 Shows a top view of the mainframe of the Dual Coating System having all pumps removed.

FIG. 11 Shows a front elevational view of the left vacuum chamber door of the Dual Coating System mainframe having the enclosure panels removed.

FIG. 22 Shows a table of relative lusters and colors for various films produced by the present invention.

DETAILED DESCRIPTION OF THE INVENTION

Figure 1:
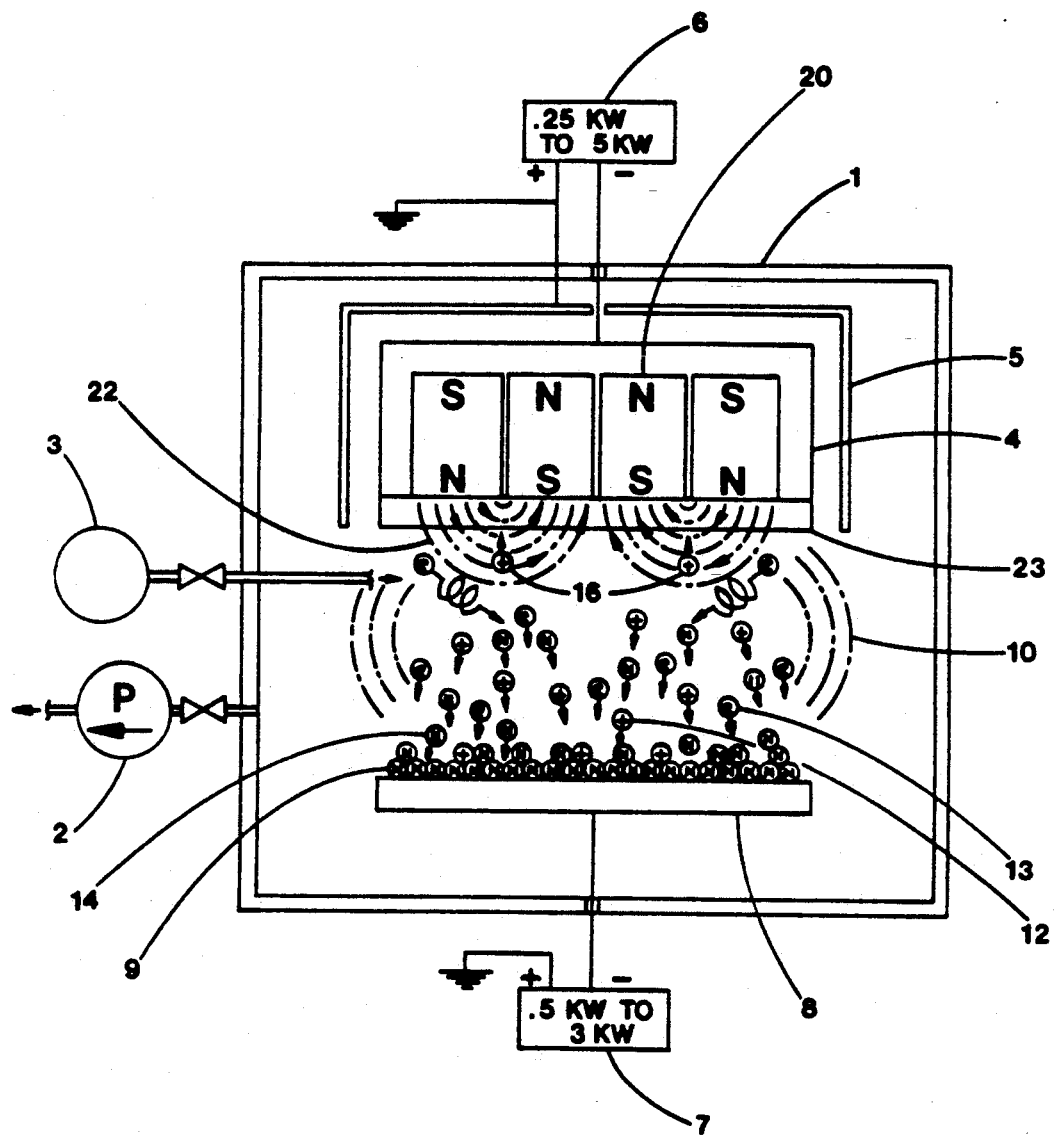
FIG. 1 Shows a schematic of a basic Planar Magnetron Sputtering System.

Referring first to FIG. 1, a basic magnetron sputtering system comprises a vacuum chamber 1, a pump system 2, and a sputtering gas source 3. The vacuum chamber 1 houses a target/cathode 4 and an anode 5. Sputtering power supply 6 biases the target/cathode 4 negative and the anode 5 positive. The sputtering process uses a high voltage and low current power supply. A substrate 8 is a workpiece to be coated with a thin film 9. Substrate 8 is biased negative by substrate power supply 7.

During the sputtering process the sputtering gas source 3 supplies non-reactant gas, argon. The pump system 2 maintains a vacuum in the range of a few milliTorr to a few tens of milliTorr. The sputtering power supply 6 powers up, causing a glow discharge 10 between the anode 5 and the target/cathode 4.

The glow discharge 10 causes positive ions of nonreactive gas, +, to bombard the target/cathode 4. See arrow 16. Momentum transfer causes neutral target atoms N, electrons e, and positive ions +, to dislodge from the target/cathode 4. Neutral target atoms N condense into thin film 9 on substrate 8. See arrow 14. Additionally a small percentage of positive ions + also condenses on the substrate. Positive ions + and electrons e also bombard the substrate 8 while thin film 9 is growing. See the arrows 12 and 13.

A magnet 20 is located behind the target/cathode 4. The magnet 20 creates a magnetic field around the target/cathode 4 as shown by lines 22. The magnetic field 22 is typically in the order of a few hundred gauss. Magnetic field 22 traps a substantial number of electrons e against the target/cathode surface 23. This effect of trapping the electrons e serves two basic purposes. First fewer electrons reach the substrate 8, thereby maintaining the substrate 8 at a cooler temperature. Second the constant motion of the electrons e at target/cathode surface 23 enhances the sputtering yield, the emission rate of neutral particles N, from the target/cathode surface 23. This enhanced sputtering yield allows a faster growing of thin film 9 on the substrate 8. Thus a manufacturing efficiency is realized by reducing the time necessary to coat thin film 9 on substrate 8.

Figure 2:
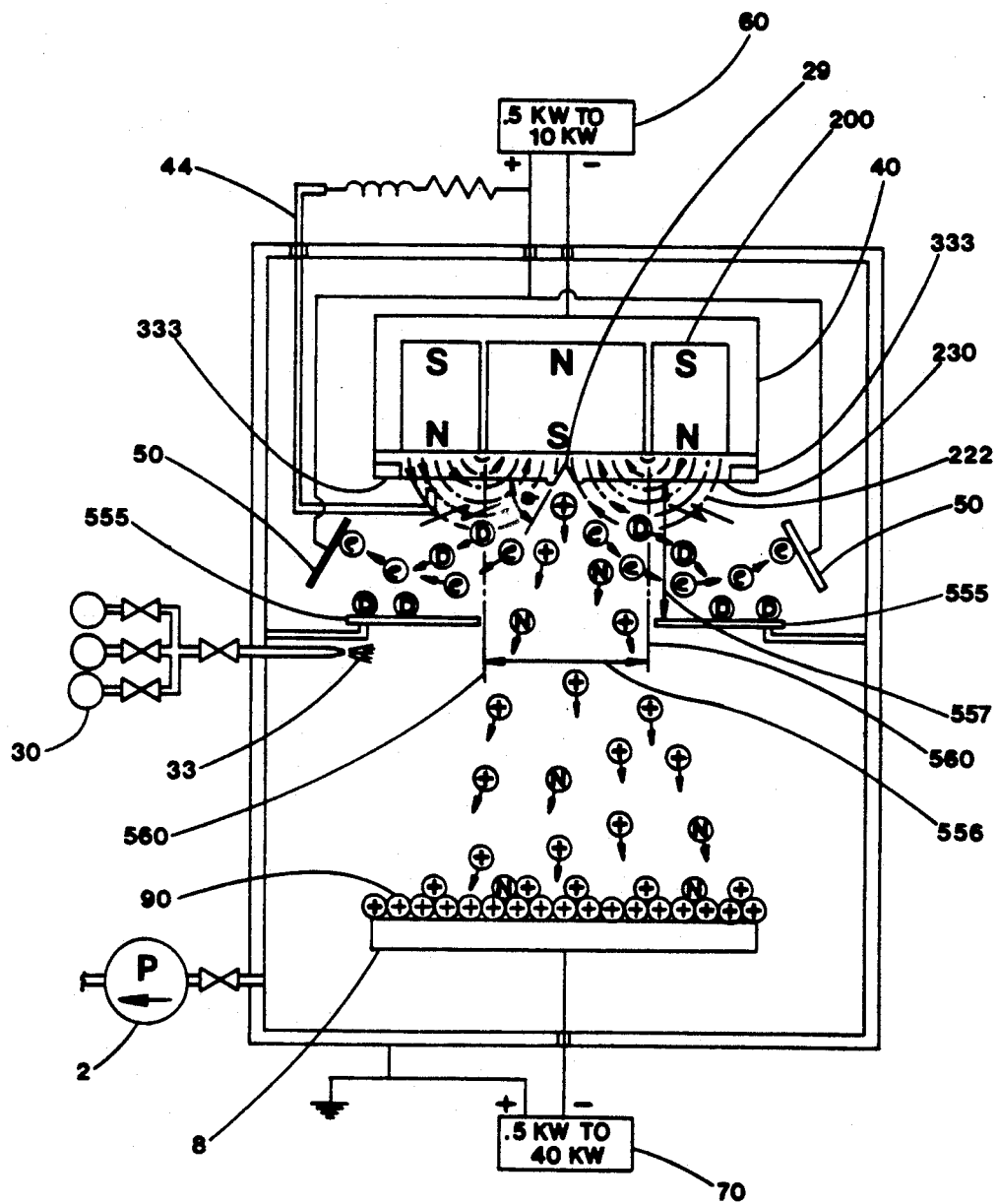
FIG. 2 Shows a schematic of a basic Cathodic Arc Plasma Deposition (CAPD) System.

Referring next to FIG. 2 a basic cathodic arc plasma deposition (CAPD) system comprises a vacuum chamber 1, a pump 2, and an optional gas source 30. The vacuum chamber 1 houses a target/cathode 40 and an anode 50. CAPD power supply 60 biases the target/cathode 40 negative and the anode 50 positive. The CAPD process uses a low voltage and high current power supply. A substrate 8 is a workpiece to be coated with a thin film 90. Substrate 8 is biased negative with respect to ground by substrate power supply 70.

During the CAPD process at least one gas 33 is introduced into the vacuum chamber 1 by gas source 30. The pump system 2 maintains a vacuum in the range of $1 \times 10^{-4}$ Torr to $1 \times 10^{-3}$ Torr. The substrate power supply 70 biases the substrate 8 to a high voltage in the range of 200 to 1000 volts DC. RF voltages may be used for non-conducting materials.

Next the CAPD power supply 60 applies voltage to the target/cathode 40 and the anode 50. Next the arc starter 44 ignites an arc 100 between the target/cathode 40 and the anode 50. An arc spot 29 forms on the target/cathode surface 230. The arc spot 29 moves at a speed of the order of a hundred meters per second on the target/cathode surface 230. Multiple arc spots 29 are created by using higher arc currents. The arc spot 29 moves under the control of the magnet 200 in a predetermined pattern. The magnet 200 produces a magnetic field 220 in the range of 10-50 gauss. The arc spot(s) 29 is confined to the target/cathode surface 230 by means of an insulating border 333.

The arc spot(s) vaporizes the target/cathode 40 thus forming a stream of positive ions +, electrons e, droplets D, and neutral atoms n. The droplets D are removed from the stream by means of deposition shields 555. Droplet removal shields 555 are suitably placed in front and to the sides of target/cathode 40.

The electrons e flow to the anode 50 of the arc circuit. The positive ions + bombard the substrate 8 thereby cleaning and heating the substrate 8.

After adequate cleaning, additional gas or gasses 33 are added into the vacuum chamber 1 to establish pressures in the range of $1 \times 10^{-3}$ Torr to $5 \times 10^{-2}$ Torr.

Next the substrate 8 is biased by substrate power supply 70 to a lower voltage in the range of 50-200 volts DC or RF.

Maintaining the arc 100 causes the thin film 90 to grow on the substrate 8 by the deposition of positive ions + and a small percentage of neutral atoms n. The thin film 90 thickness and the rate of deposition are controlled by varying the arc current, vacuum chamber 1 pressure, the substrate 8 bias voltage, the substrate temperature and the process time.

Figure 3:
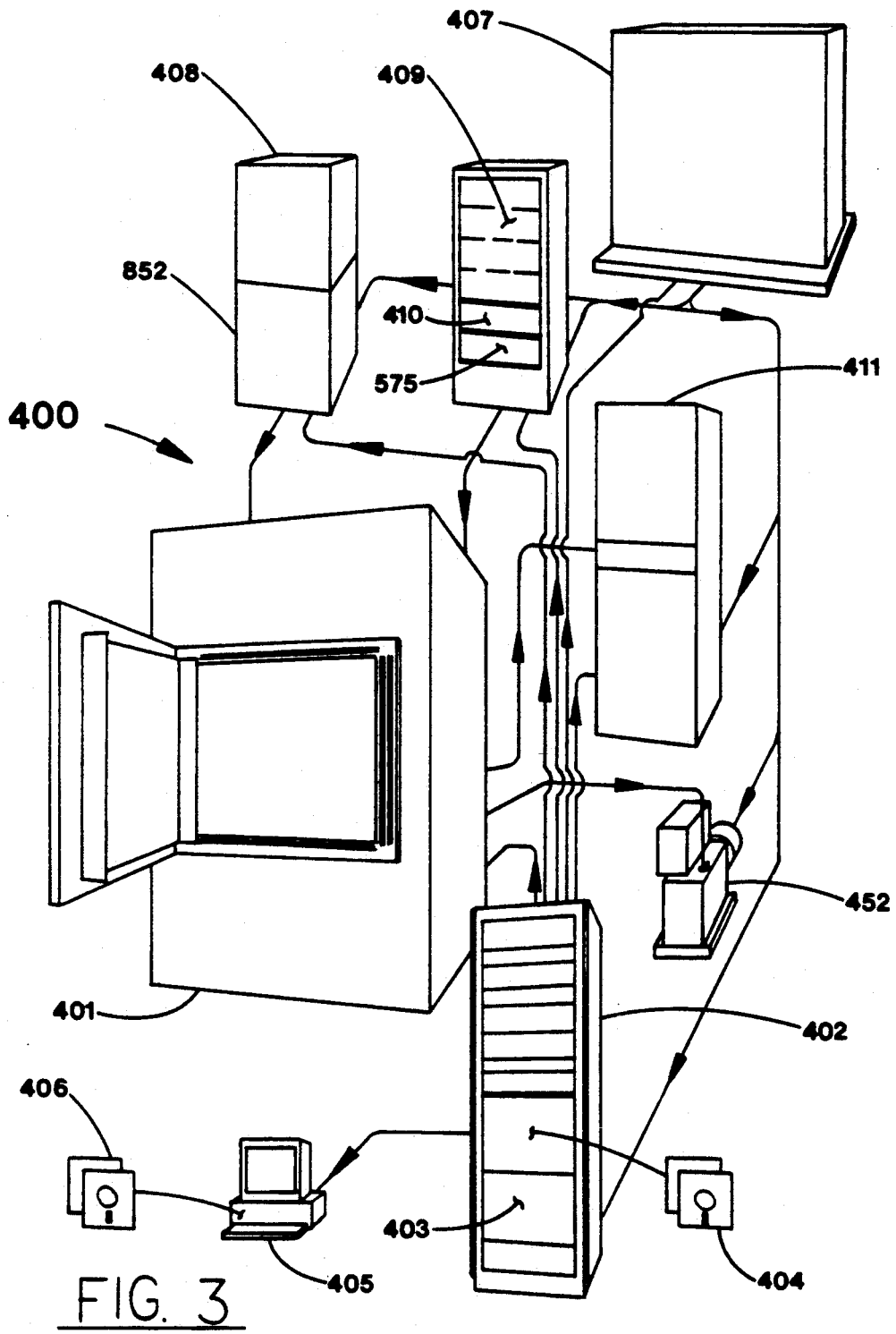
FIG. 3 Shows a schematic of the major components of the Dual Coating System of the invention.

Referring next to FIG. 3, the Dual Coating System 400 comprises a mainframe 401, a master control panel 402, a programmable logic controller (PLC) 403, PLC software 404, a personal computer (PC) 405, PC software 406, a power distribution panel 407, arc source power supplies 408, 852, a substrate bias power supply 409, sputtering power supplies 410, 575, a control unit for the cryogenic trap 411, and a mechanical pump 452.

Figure 4:
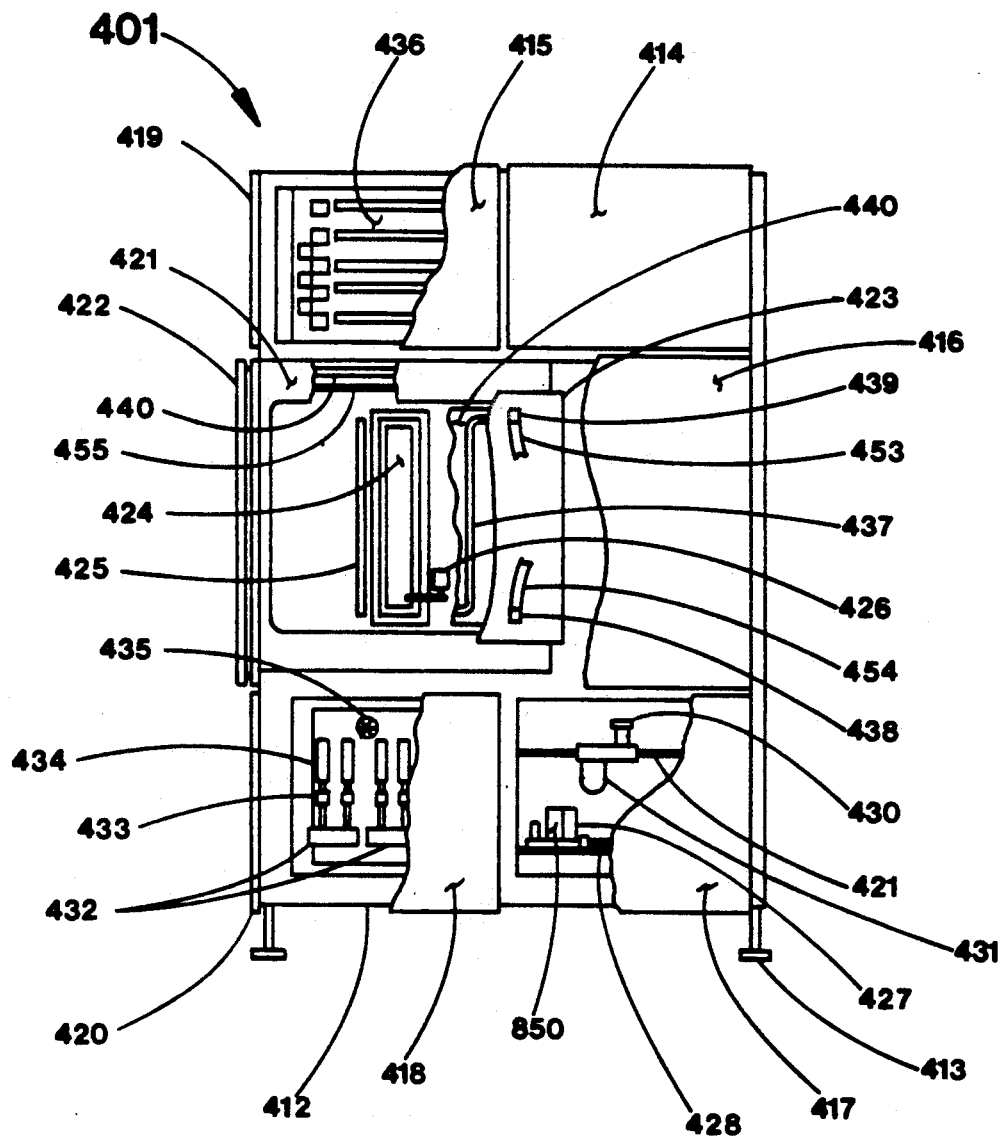
FIG. 4 Shows a right side elevational view of the Dual Coating System mainframe having partial cutaways.

Referring next to FIG. 4 the right side of the Dual Coating mainframe 401 has a support skeleton 412, leveling feed 413, enclosure panels 414, 415, 416, 417, 418, 419, and 420, vacuum chamber 421, front chamber door 422, right side chamber door 423, CAPD cathode 424, CAPD anode 425, arc starter 426, process gas mass flow control valves 427, a flow sensor 850, process gas supply pipe 428, a compressed air supply pipe 429, a compressed air pressure regulator 430, a compressed air filter 431, a cooling water supply manifold 432, a cooling water flow control valve 434, a cooling water safety switch 435, and an electrical terminal board 436.

Multiple chamber doors 422, 423 serve to offer ease of access to internal components for maintenance as well as flexibility in loading and unloading workpieces. Compressed air components 429, 430, and 431 operate the pneumatic valves in the Dual Coating System 400. Cooling water components 432 and 434 distribute and control cooling water to the internal chamber pipes 437. Inlet port 438 and outlet port 439 in combination with internal chamber pipes 437 and cooling water supply manifold 432 form an internal water cooled surface 440 around vacuum chamber 421. Cooling water safety switch 435 working in conjunction with master control panel 402 shuts off all power if cooling water flow drops below a predetermined setpoint. The electrical terminal board 436 serves as the common termination point for all wiring to the mainframe 401.

Figure 5:
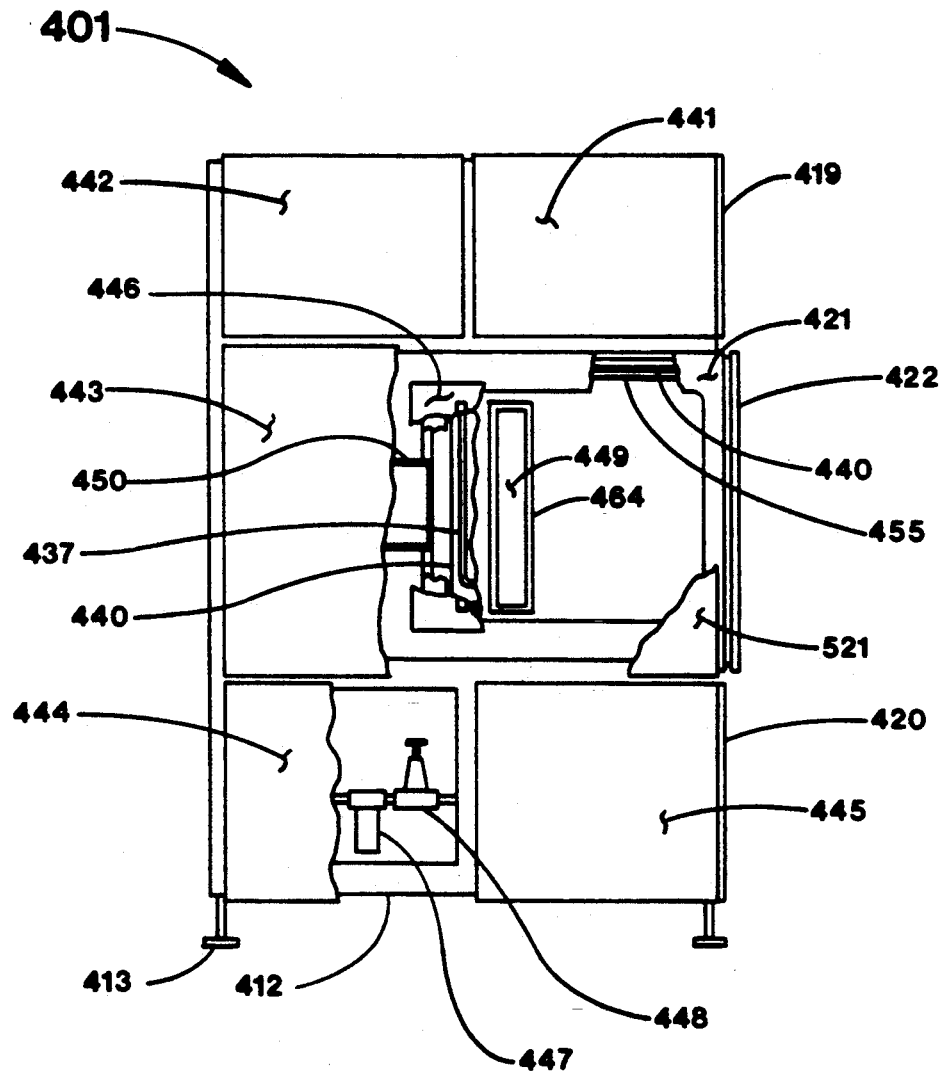
FIG. 5 Shows a left side elevational view of the Dual Coating System mainframe having partial cutaways.

Referring next to FIG. 5, mainframe 401 has enclosure panels 441, 442, 443, 444, 445, 419 and 420, left side chamber door 446, cooling water filter 447, cooling water regulator 448, sputtering cathode 449, sputtering anode 464, and high vacuum pumping port 450.

Figure 9:
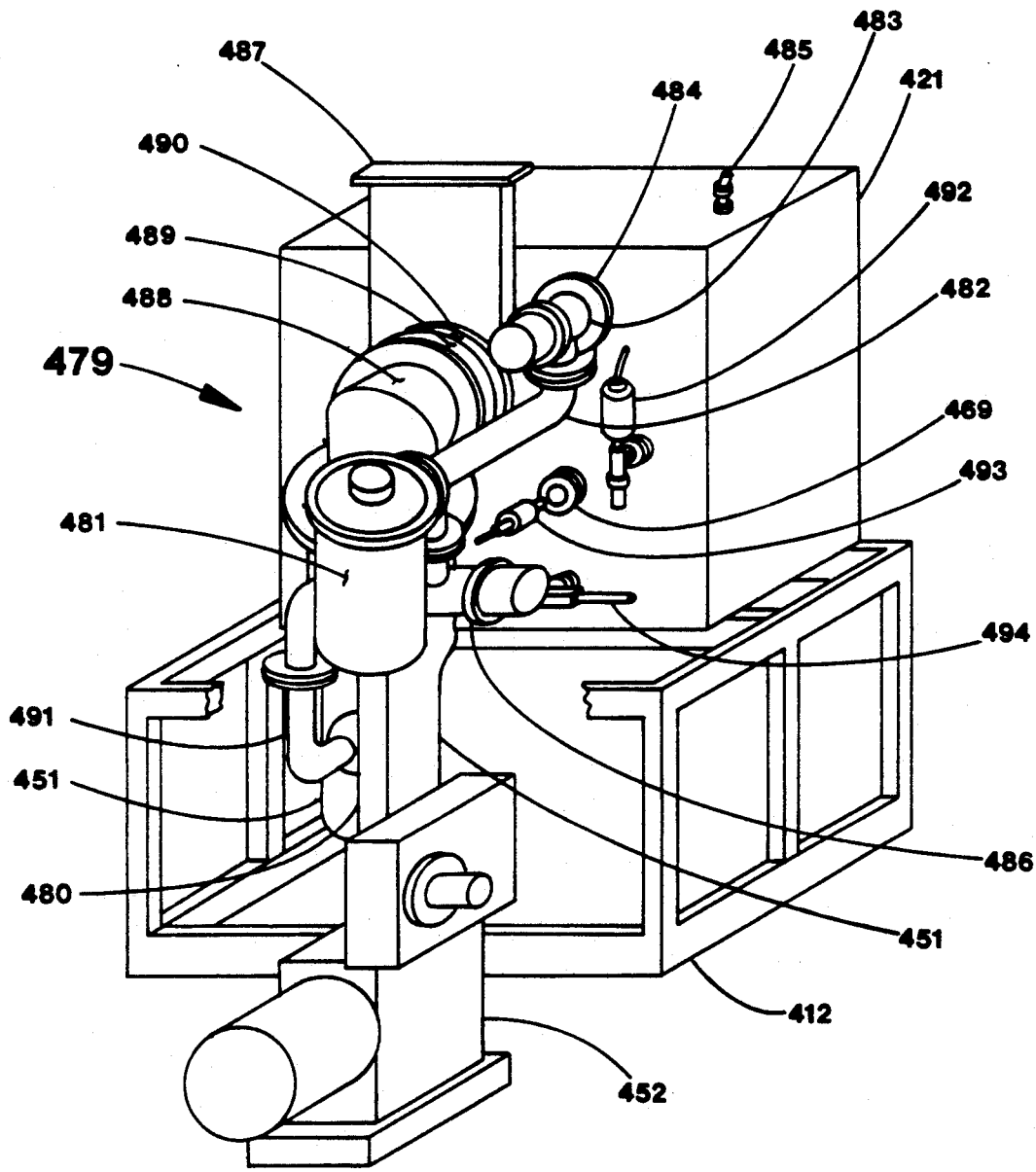
FIG. 9 Shows a top perspective view of the back of the Dual Coating System mainframe having cutaways of all enclosure panels and the upper support frame.

Mainframe 401 has three chamber doors 446, 422 and 423 for process and maintenance flexibility. High vacuum pumping port 450 connects to the cryogenic trap 489 and the diffusion pump 451 (FIG. 9).

Figure 6:
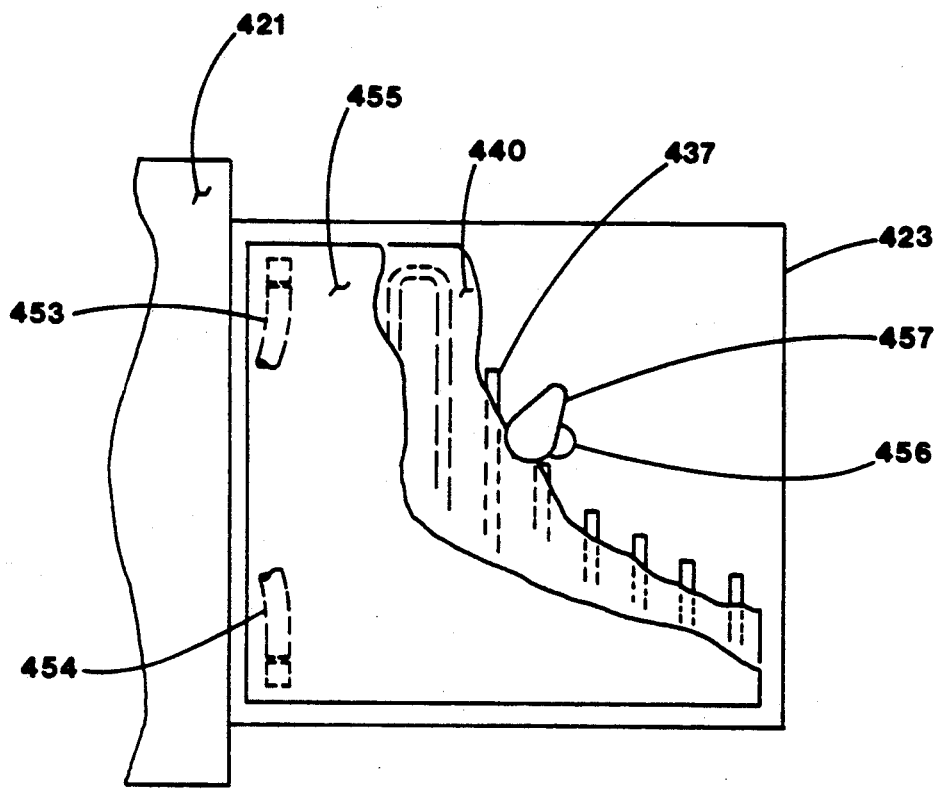
FIG. 6 Shows the interior view of the right chamber door of the Dual Coating System mainframe.

Referring next to FIG. 6, the right chamber door 423 contains the same internal chamber pipes 437 as the rest of the chamber. Flexible hoses 453 and 454 carry cooling water into the right chamber door 423.

A deposition shield 455 overlays the water cooled surface 440. Deposition shield 455 is generally made of stainless steel and serves to protect the underlying surfaces from the deposition processes.

A viewport 456 allows users to peer into the vacuum chamber 421. A viewport shutter 457 is manually placed in front of the viewport 456 to protect the viewport 457 from the deposition process.

Figure 7:
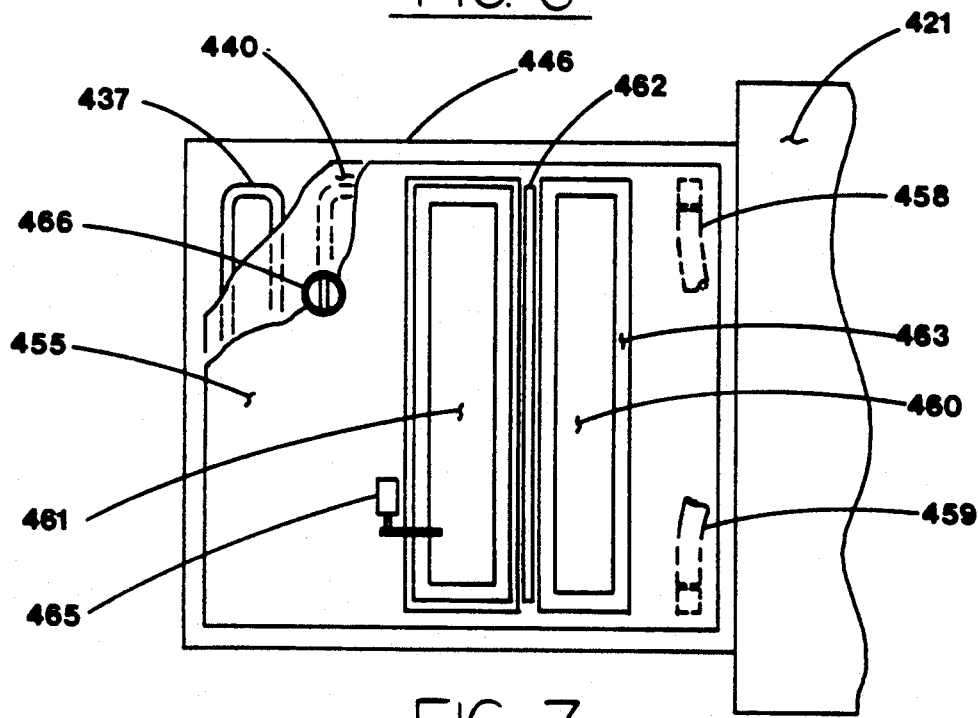
FIG. 7 Shows the interior view of the left chamber door of the Dual Coating System mainframe.

Referring next to FIG. 7, the left chamber door 446 has internal chamber pipes 437 and flexible hoses 458 and 459, and deposition shield 455. A door mounted sputtering cathode 460 is powered during the sputtering process. A door mounted CAPD cathode 461 is powered during the CAPD process. Sputtering anode 463 and CAPD anode 462 are shown. Arc starter 465 starts the vacuum arc during the CAPD process.

The substrate temperature monitor 466 is an infrared sensor.

Figure 8:
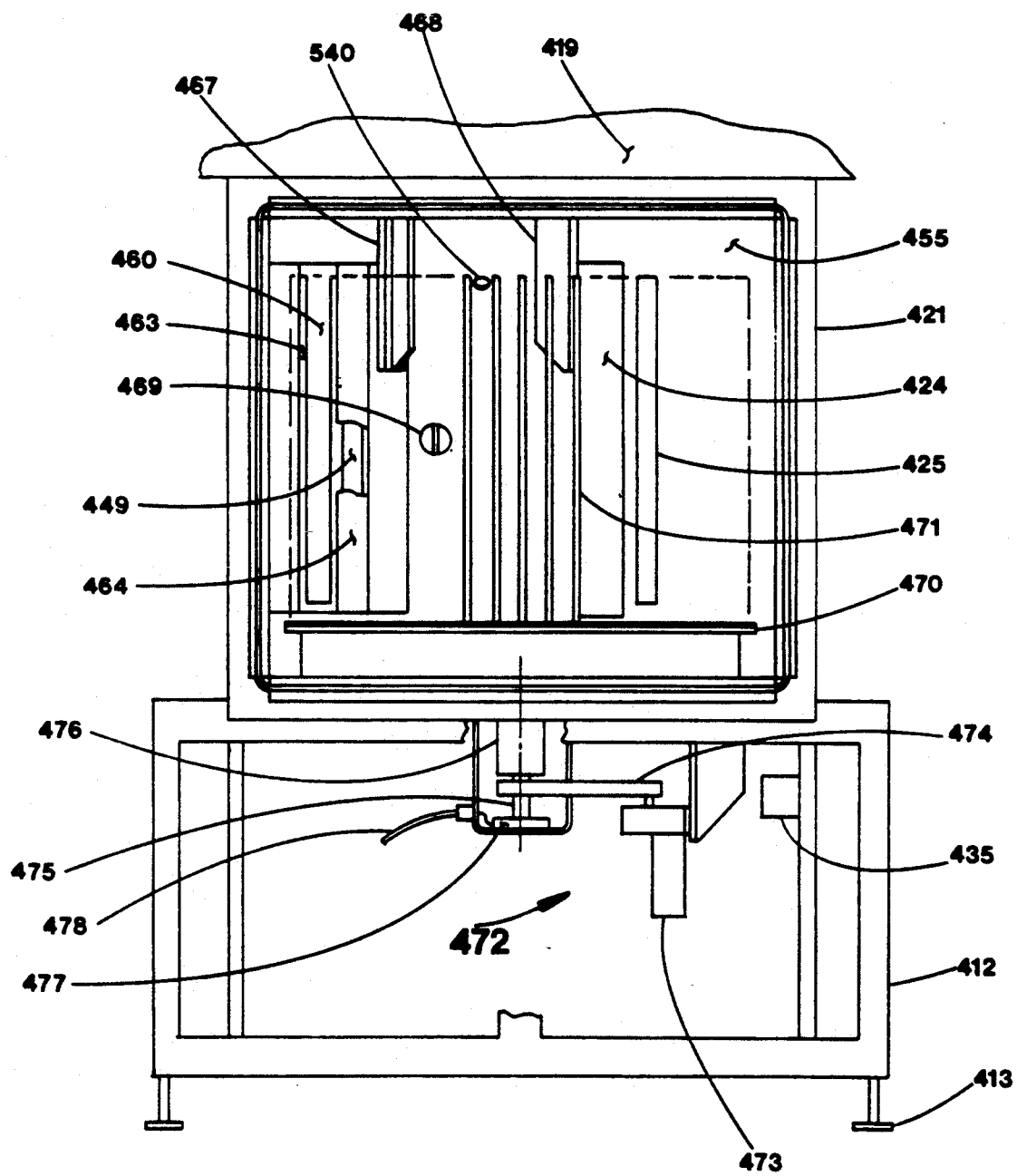
FIG. 8 Shows a front elevational view of the Dual Coating System mainframe with the front chamber door and front enclosure panels cutaway.

Referring next to FIG. 8, vacuum chamber 421 houses internally mounted CAPD cathode 424 and the corresponding CAPD anode 425, the CAPD cathode mounting bracket 468, internally mounted sputtering cathode 449, and the corresponding sputtering anode 464, the sputtering cathode mounting bracket 467, door mounted sputtering cathode 460 and the corresponding sputtering anode 463, a second substrate temperature infrared sensor 469, the substrate turntable 470, and the substrate mounting fixture 471.

The substrate turntable 470 rotates under the control of the master control panel 402 during either the sputtering or CAPD process. The substrate mounting fixture 471 is custom designed for various substrates.

A substrate turntable drive assembly 472 comprises a drive motor 473, a drive belt 474, a turntable drive shaft 475, a rotary vacuum seal 476, substrate bias voltage connection 477, and the substrate bias voltage cable 478.

Drive motor 473 is a variable speed unit enabling precise control of the substrate turntable 470 speed. The rotary vacuum seal 476 maintains the integrity of the vacuum chamber 421 during processes. The bias voltage cable 478 connects to the substrate bias power supply 409 (FIG. 3).

Referring next to FIG. 9, the Dual Coating System pumping assembly 479 is shown. The pumping assembly 479 starts with the mechanical pump 452. Mechanical pump 452 pumps the vacuum chamber to a crossover pressure ranging from 60 to 90 mTorr. Mechanical pump 452 connects to the vacuum chamber 421 through the inlet pipe 480, the inlet filter 481, the connector pipe 482, the roughing valve 483 and the chamber roughing port 484.

Thermocouple gauge 485 measures vacuum chamber 421 pressure and transmits this pressure to the master control panel 402 (FIG. 3). When the vacuum chamber 421 pressure reaches a predetermined crossover pressure ranging from 60 to 90 mTorr, the master control panel 402 closes the roughing valve 483 and opens the foreline valve 485 and opens the high vacuum valve 487. These valve actions connect the mechanical pump 452 in series with the diffusion pump 451. These serial pumps 451 and 452 are connected to the vacuum chamber 421 through the high vacuum piping 488 and the cryogenic trap 489 and the throttle valve 490 and the high vacuum valve 487 and the chamber high vacuum port 450 (FIG. 5).

After the above noted crossover procedures are accomplished, the mechanical pump 452 maintains the diffusion pump foreline 491 at low pressure while the diffusion pump 451 further reduces the vacuum chamber 421 pressure to a system base pressure ranging from $2 \times 10^{-5}$ to $5 \times 10^{-7}$ Torr. Simultaneously the cryogenic trap 489 condenses water vapor and other condensable gasses thereby increasing the efficiency of the diffusion pump 451.

Process pressures are controlled by the master control panel 402 operating the throttle valve 490 in response to signals from the capacitance manometer sensor 492. The foregoing control loop is known as a downstream pressure control system. The infrared temperature sensor 493 views the substrates 540 through viewport 469, (see FIG. 8) thereby providing the temperature control signal to the master control panel 402.

When processing is complete the vacuum chamber 421 is raised back to atmospheric pressure by means of vent valve 494.

Referring next to FIG. 10, the top of the vacuum chamber 495 is seen supported by the support skeleton 412. Water inlet 497 provides cooling water to the internal chamber pipes 437 as supplied by the cooling water supply manifold 432, see FIG. 4. Water outlet 499 is then returned to the cooling water supply manifold 432.

CAPD cathode utility plate 500 contains the electrical power leads 501 to the anode and 502 to the cathode of the CAPD cathode 424 and CAPD anode 425 as seen in FIG. 4. Anode cooling water inlet 503 feeds CAPD anode 425, and the anode cooling water outlet 504 returns to the cooling water supply manifold 432. Insulating enclosure 505 protects the CAPD cathode utility plate 500 from anode electricity. Cooling water inlet 591 supplies cooling water from the cooling water supply manifold 432 (FIG. 4) to the CAPD cathode 424. An outlet 592 returns the cooling water to the cooling water supply manifold 432.

Sputtering cathode utility plate 506 contains the electrical power leads 507 to the anode and 508 to the cathode of the sputtering anode 464 and sputtering cathode 449 as shown in FIG. 5. Insulating enclosure 590 insulates the sputtering cathode utility plate 506 from electricity. Cooling water inlet 496 provides cooling water to the sputtering cathode 449 from the cooling water supply manifold 432. Cooling water return provides the return to cooling water supply manifold 432.

Electric power for the arc starter 426 is supplied by leads 509 and 510. Electric power for the CAPD cathode electromagnet 530 is supplied by cable 531.

Shield armature 512 (see FIG. 15) is activated by activating assembly 511. Activating assembly 511 consists of a pneumatic cylinder 515 and crank arm 516.

Vacuum chamber 421 pressure is sensed and transmitted by pirani gauge 517, thermocouple gauge 518 and ion gauge 519. Pirani type gauge 517 measures pressures ranging from atmospheric to 1 mTorr. Thermocouple gauge 485 measures pressures ranging from atmospheric to 1 mTorr. Ion gauge 519 measures pressures ranging from 1 mTorr–0.0001 mTorr. Thermocouple gauge 518 triggers the master control panel 401 for switching the ion gauge 519 on.

Referring next to FIG. 11, the vacuum chamber 421 is seen supported by the support skeleton 412. The left vacuum chamber door 520 opens for loading and maintenance. An enclosure panel 521 is cut away. Water inlet 522 and water outlet 523 feed the internal chamber pipes 437 from the cooling water supply manifold 432. Water inlet 593 supplies cooling water from the cooling water supply manifold 432 to the door mounted CAPD cathode 461. Outlet 594 returns the cooling water through the cooling water supply manifold 432.

The door mounted CAPD cathode 461 is mounted inside CAPD door enclosure 524. Power to the door mounted CAPD cathode is supplied by lead 525. Power to the CAPD anode 462 is supplied by lead 526. Cooling water inlet 527 supplies cooling water from the cooling water supply manifold 432 to the door mounted CAPD anode 462 as shown in FIG. 7. Cooling water return 528 supplies the return to cooling water supply manifold 432.

Electrical insulating enclosure 529 electrically isolates the door mounted CAPD anode 462. Electrical insulating enclosure 532 electrically isolates the door mounted CAPD cathode 461. CAPD electromagnet 530 (FIG. 17) is powered by cable 533. Water inlet 534 supplies cooling water from the cooling water supply manifold 432 to the door mounted sputtering cathode 460 (see FIG. 7). The water returns via water outlet 535. Lead 536 powers the door mounted sputtering cathode 461. Leads 537 and 538 power the arc starter 465 (FIG. 7).

An infrared sensor 539 measures the substrate 540 temperature as shown in FIG. 8. The infrared sensor 539 consists of a lens assembly 541, a fiber optic cable 542, and the infrared sensing unit 543. Infrared sensing unit 543 measures and transmits the substrate 540 temperature to the master control panel 402. High intensity light source 544 calibrates lens assembly 541. Enclosure safety switches 560 prevent operation if an enclosure panel is ajar.

Figure 12:
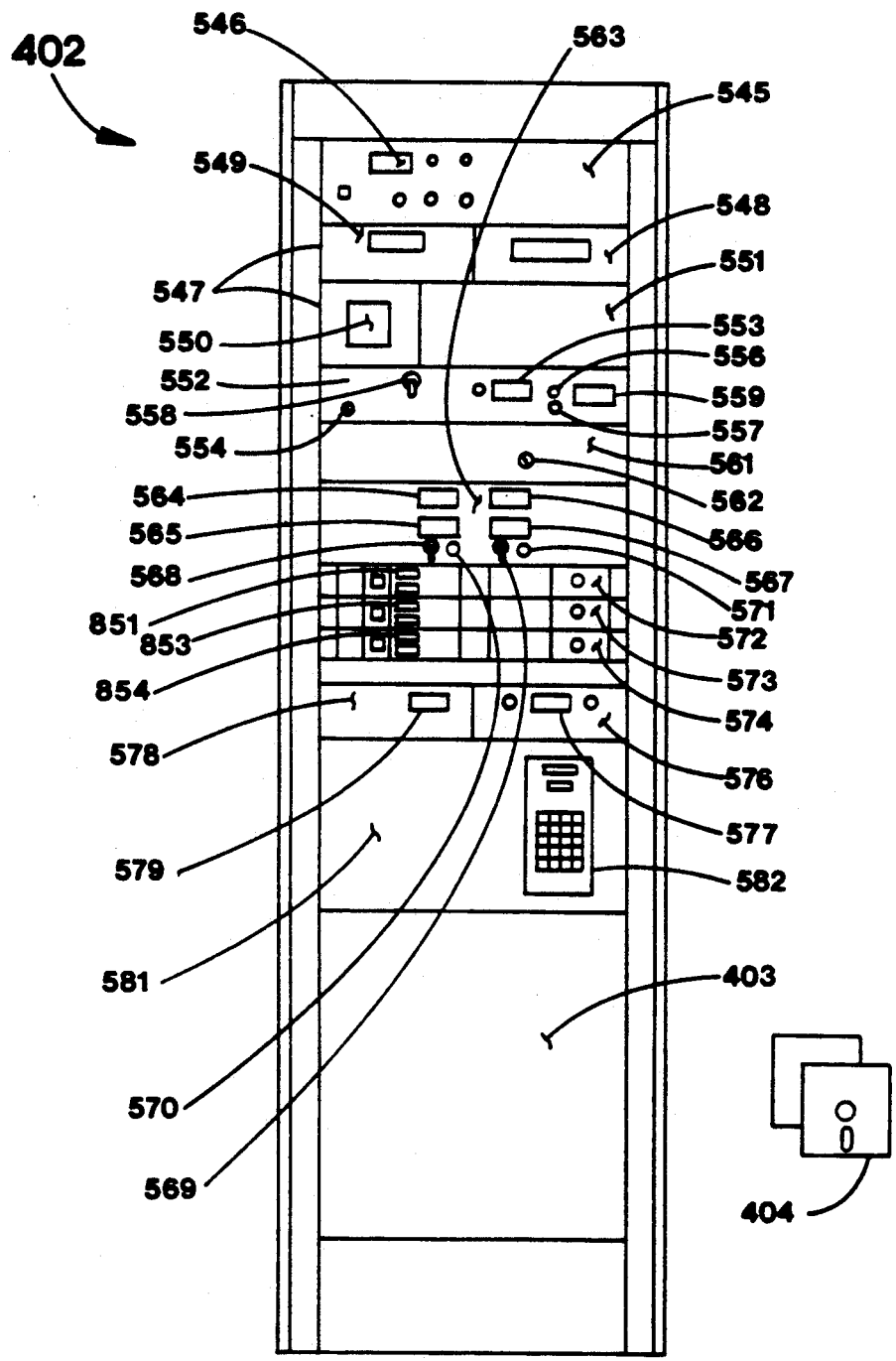
FIG. 12 Shows a front elevational view of the master control panel.

Referring next to FIG. 12, the master control panel 402 consists of a substrate temperature transmitter 545 which indicates temperatures from the infrared sensors 493 and 543 by means of gauge 546.

Substrate temperature transmitter 545 switches between infrared sensing units 493 and 543 and subsequently transmits the substrate temperatures to the programmable logic controller (PLC) 403.

The vacuum chamber pressure monitoring panel 547 consists of a thermocouple gauge indicator 548 which senses inputs from the thermocouple sensor 518 (FIG. 10). The ion gauge indicator 549 senses inputs from the ion tube 519 (FIG. 10). The pirani gauge indicator 550 senses inputs from the pirani gauge sensor 517. Additionally the pirani gauge indicator 550 transmits signals to the valve control panel 551 which in turn controls the roughing valve 483, the high vacuum valve 487, and the vent valve 494. The valve control panel 551 also controls the diffusion pump foreline valve 486 and the throttle valve 490 (FIG. 9).

The system control panel 552 consists of a drive motor 473 speed indicator/controller 553. Additionally the system control panel 552 provides a manual-/automatic mode of operation by means of selector switch 554. Manual control switch 558 offers manual control of the process gas mass flow control valve 427 (FIG. 4). To initiate either the CAPD or sputtering process master start switch 556 must be switched "on". Process termination may be manually accomplished by switching the process stop switch 557 "off". A process status board 559 indicates the statuses of vacuum chamber 421 pressure range, cooling water safety switch 435 (FIG. 4), enclosure safety switch 560 (FIG. 11) status, drive motor 473 overtorque indicator (FIG. 8), and the overall process enable status indicator.

The process selection panel 561 provides selection of either the CAPD or sputtering process by means of selector switch 562.

The arc control panel 563 displays the respective CAPD voltages and amperages by means of indicators 564, 565, 566, and 567. The operator may manually select whether to use one or both of the CAPD cathodes 424/461 by means of selector switches 568 and 569. The CAPD arc power may be manually controlled by potentiometers 570 and 571.

Varying substrate 540 surface areas require varying bias power requirements. Substrate bias power control module 572 controls the bias power supply 409 and indicates bias voltage by means of indicator 851. The internal sputtering cathode controls the internal sputtering power supply 410. The door mounted sputtering cathode power control module 574 controls the door mounted sputtering power supply 575 (FIG. 3). Power indicators 853 and 854 integral to the sputtering cathode control modules 573 and 574 indicate the electrical power levels of the respective sputtering cathodes.

The capacitance manometer sensor 492 (FIG. 9) transmits a signal to the capacitance manometer controller 576. The vacuum chamber 421 pressure is indicated by the indicator 577 integral to the capacitance manometer controller 576. Additionally, the capacitance manometer controller 576 provides an input signal to the process gas controller 578.

The process gas controller 578 displays the process gas flow by means of indicator 579. Flow sensor 850 (FIG. 4) supplies input to the indicator 579. The process gas controller 578 modulates process gas mass flow control valve 427 in response to signals from the capacitance manometer controller 576, thereby controlling vacuum chamber 421 pressure. The foregoing control loop constitutes an upstream pressure control system.

Support panel 581 houses the PLC input module 582. PLC input module 582 is used to key enter variable data into the PLC 403. The PLC 403 contains PLC software 404 which automatically can control all the CAPD and sputtering process functions for the Dual Coating System 400.

Figure 13:
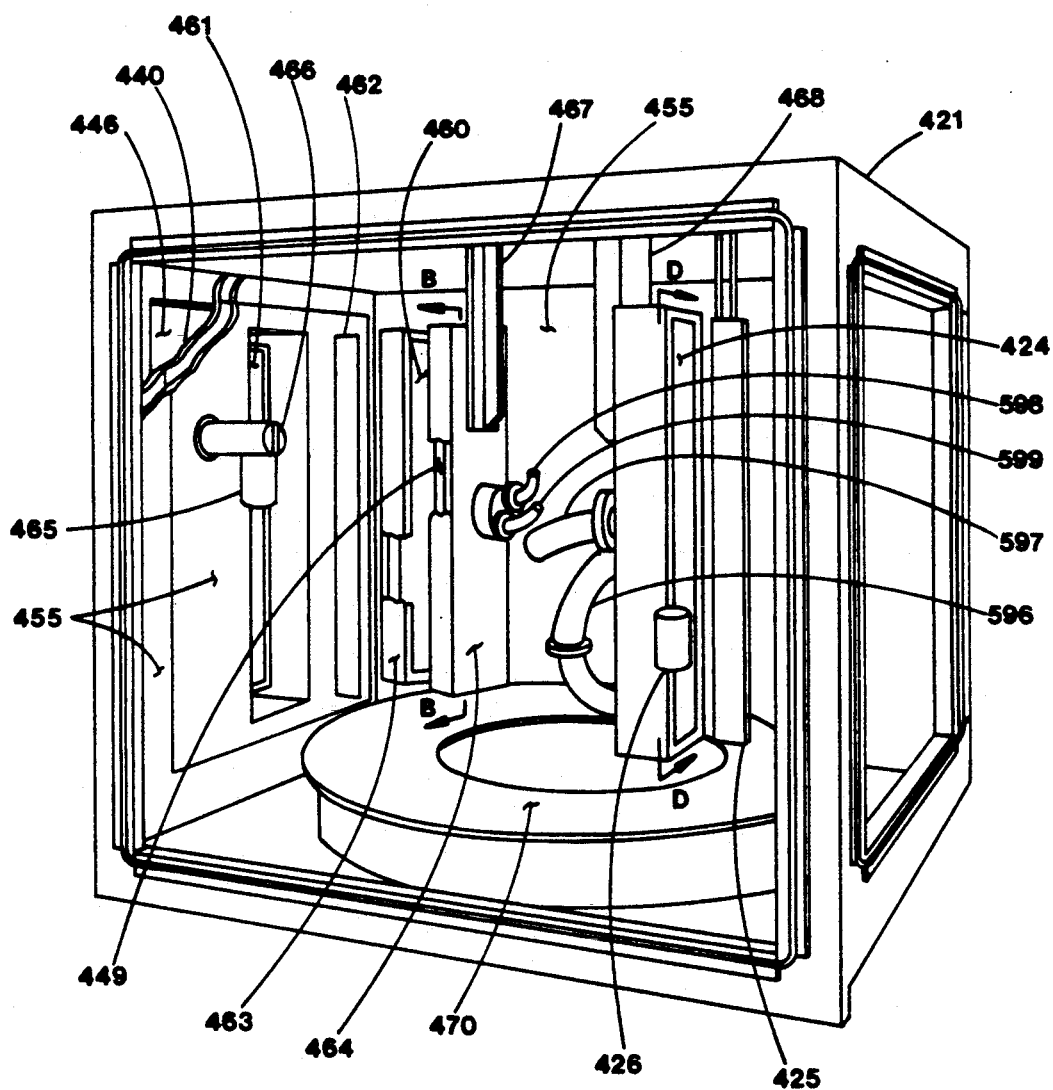
FIG. 13 Shows a front perspective view of the vacuum chamber portion of the Dual Coating System mainframe. The front and right side doors are removed.
Figure 14:
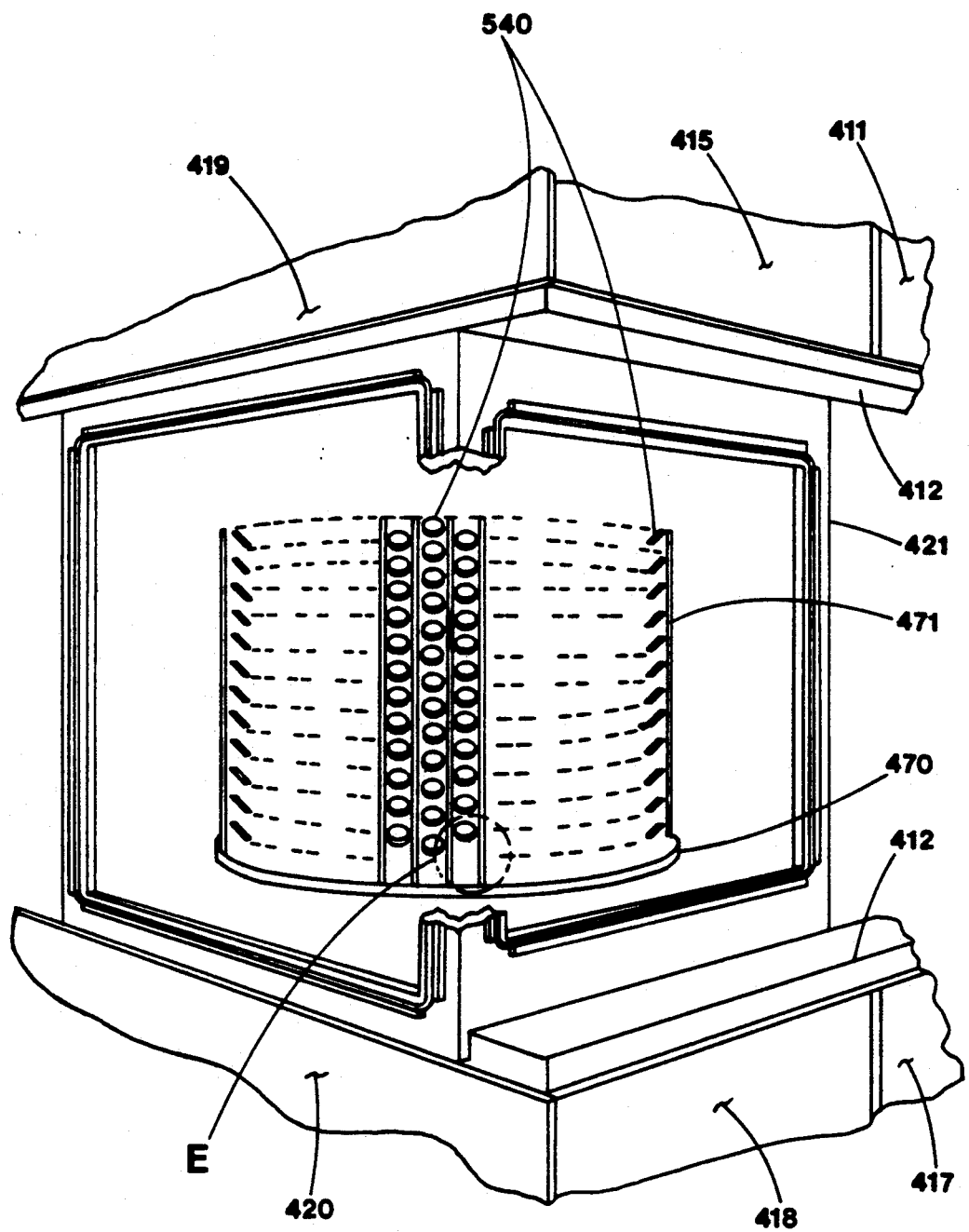
FIG. 14 Shows a front perspective view of the vacuum chamber and substrate fixturing.
Figure 15:
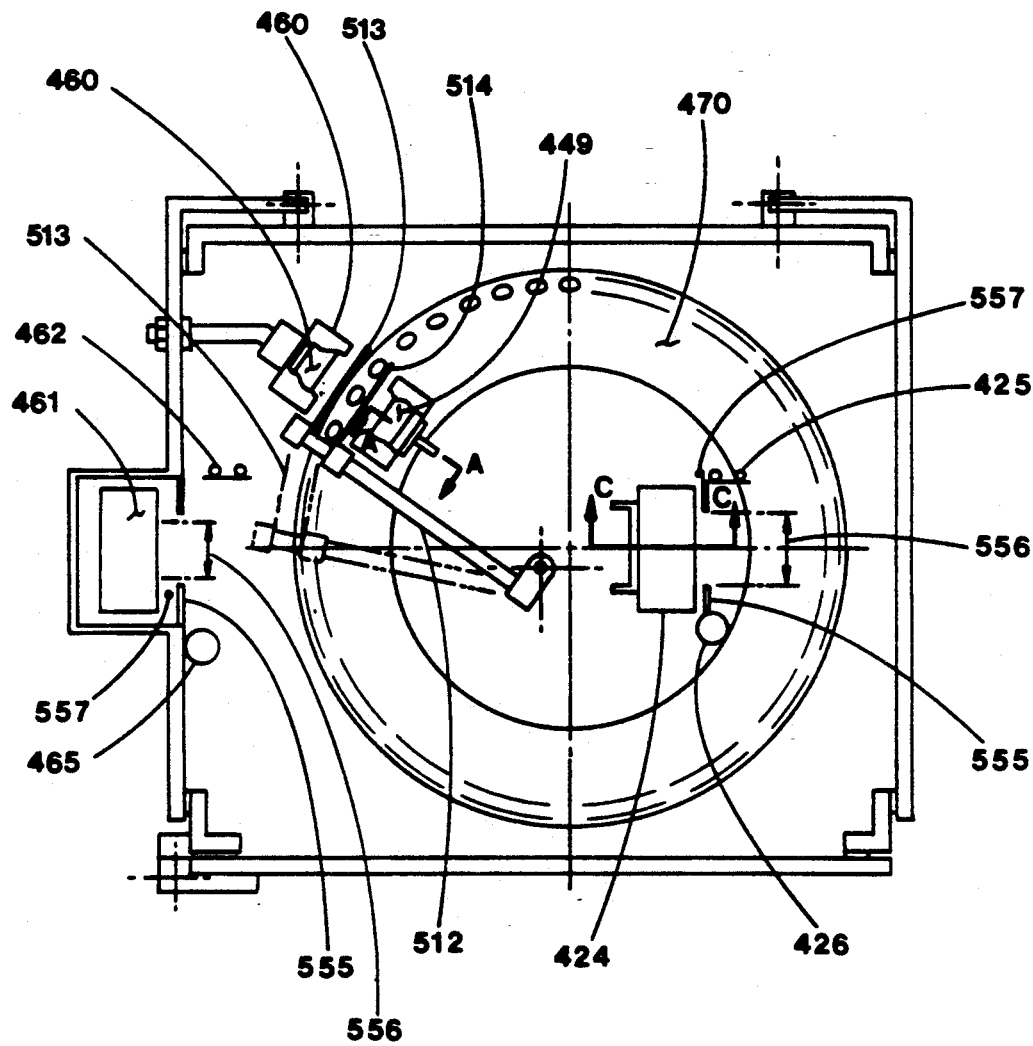
FIG. 15 Shows a top view cross section of the vacuum chamber showing all major process cathodes.

FIGS. 13, 14 and 15 show the spatial relationships of the main operating components of the Dual Coating System 400. FIG. 13 shows the substrate turntable 470.

The internally mounted CAPD cathode 424 is supported above and in close proximity to the substrate turntable 470 by means of the CAPD cathode mounting bracket 468. The corresponding CAPD anode 425 and arc starter 426 are commonly mounted to the same CAPD cathode mounting bracket 468. Utility cable 596 and 597 house cooling water pipes and electrical conductors serving the internally mounted CAPD cathode 424.

The internally mounted sputtering cathode 449 and corresponding anode 464 are mounted on the sputtering cathode mounting bracket 467. Corresponding utility cables 598 and 599 house cooling water pipes and electrical conductors serving the internally mounted sputtering cathode 449.

The door mounted sputtering cathode 460 and its corresponding anode 463 faces the internally mounted sputtering cathode 449 such that simultaneous sputtering coating on both sides of the substrate 540 can be accomplished.

The door mounted CAPD cathode 461 coats the outside of the substrate 540 while the internally mounted CAPD cathode coats the inside of the substrate 540. The corresponding CAPD arc starter 465 and anode 462 are mounted on the same left chamber door 446. The substrate temperature monitor 466 protrudes beyond the deposition shield 455.

FIG. 14 shows a typical mounting arrangement for small substrates such as rings. The substrate turntable 470 is in electrical contact with the substrate mounting fixture 471 which in turn is in electrical contact with the substrate 540.

FIG. 15 shows in dotted lines how the shield armature 512 moves the sputtering cathode shields 513 and 514 away from the sputtering cathodes 449 and 460 during the sputter coating. The shield armature 512 shown in solid lines moves the sputtering cathode shields 513 and 514 in front of the sputtering cathodes 449 and 460 to protect them from being coated during the CAPD process.

An alternate embodiment (not shown) uses RF sputtering cathodes either in addition to or in lieu of the magnetron sputtering cathodes 449 and 460. Additionally RF substrate biasing (not shown) may be used.

A second alternate embodiment (not shown) uses diode sputtering either in addition to or in lieu of the magnetron sputtering cathodes 449 and 460.

The droplet removal shields 555 (see FIG. 2) serve to remove all droplets D from the stream of positive ions, electrons, and neutral atoms vaporizing from the door mounted CAPD cathode 461 and the internally mounted CAPD cathode 424.

Referring to FIG. 2, the droplets D comprise molten metal particles which if allowed to land on the substrate 8 result in rough and low luster films. This is unacceptable for decorative applications. It has been experimentally determined that droplets D are emitted at angles $\theta$ or less. $\theta$ has been found to be 30 degrees or less when the CAPD target 615 (FIG. 17) has a minimal area of ten square inches. The distance 557 of the droplet removal shields 555 and the opening 556 are selected to prohibit the droplets D from reaching the substrate 8 (FIG. 2).

The main purpose of the present invention is to provide a film having a high luster and a consistent color controllable to match various gold colors. FIG. 22 shows a sampling of films produced by the present invention. Sequence Numbers 8 and 9 list the 10 carat and 24 carat gold characteristics used herein as a standard. L* denotes the luster or brilliance of the film as measured per the CIE Lab color coordinates. a* denotes a range of red to green contents in the film. Positive a* values denote red contents and negative a* values denotes green contents in the film. b* denotes a range of yellow to blue contents in the film. The positive b* values indicate a high yellow content in the film. Negative values would indicate a blue content in the film.

Figure 19:
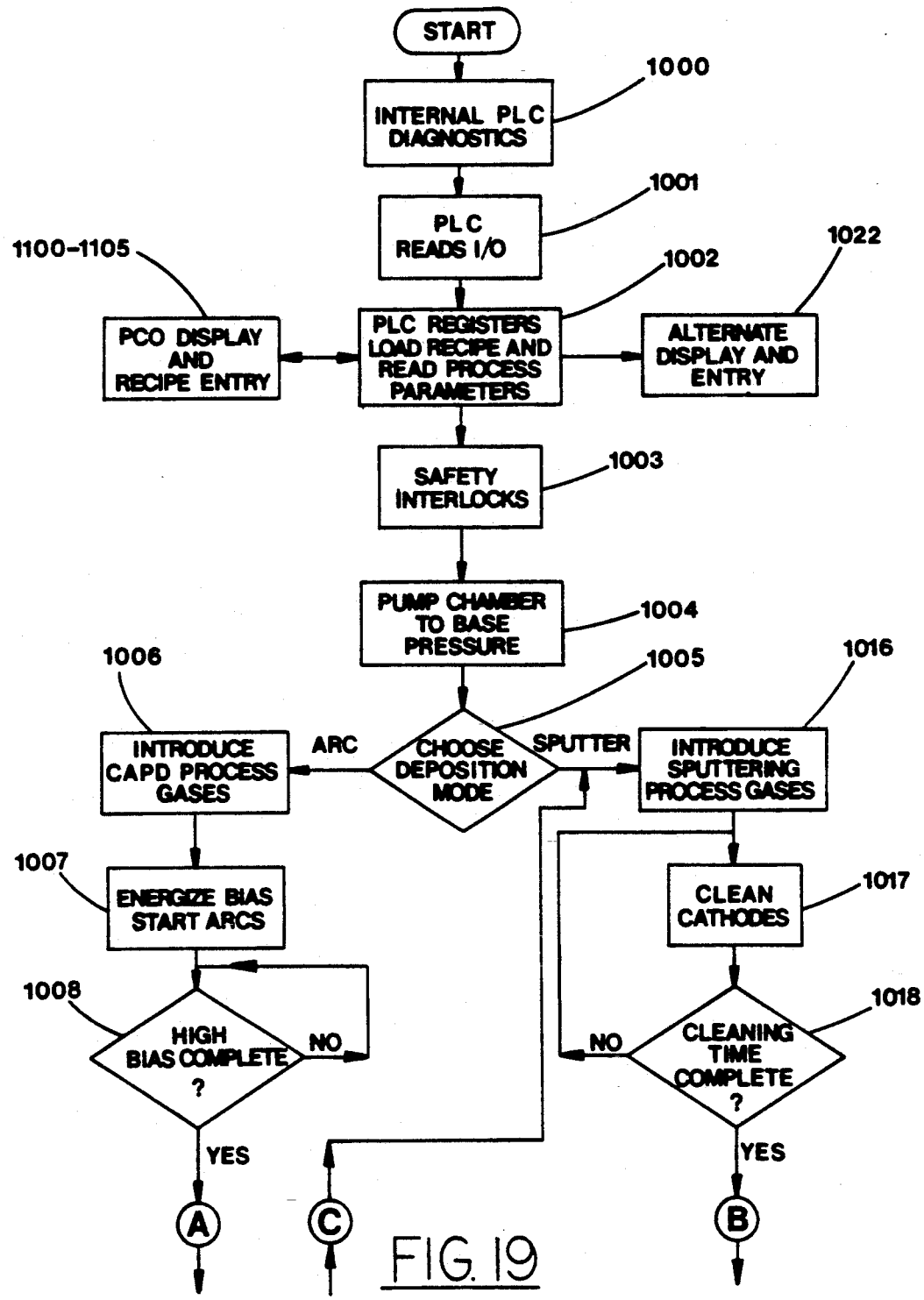
FIG. 19 Shows a software flow chart of the Program Logic Controller (PLC) logic.
Figure 20:
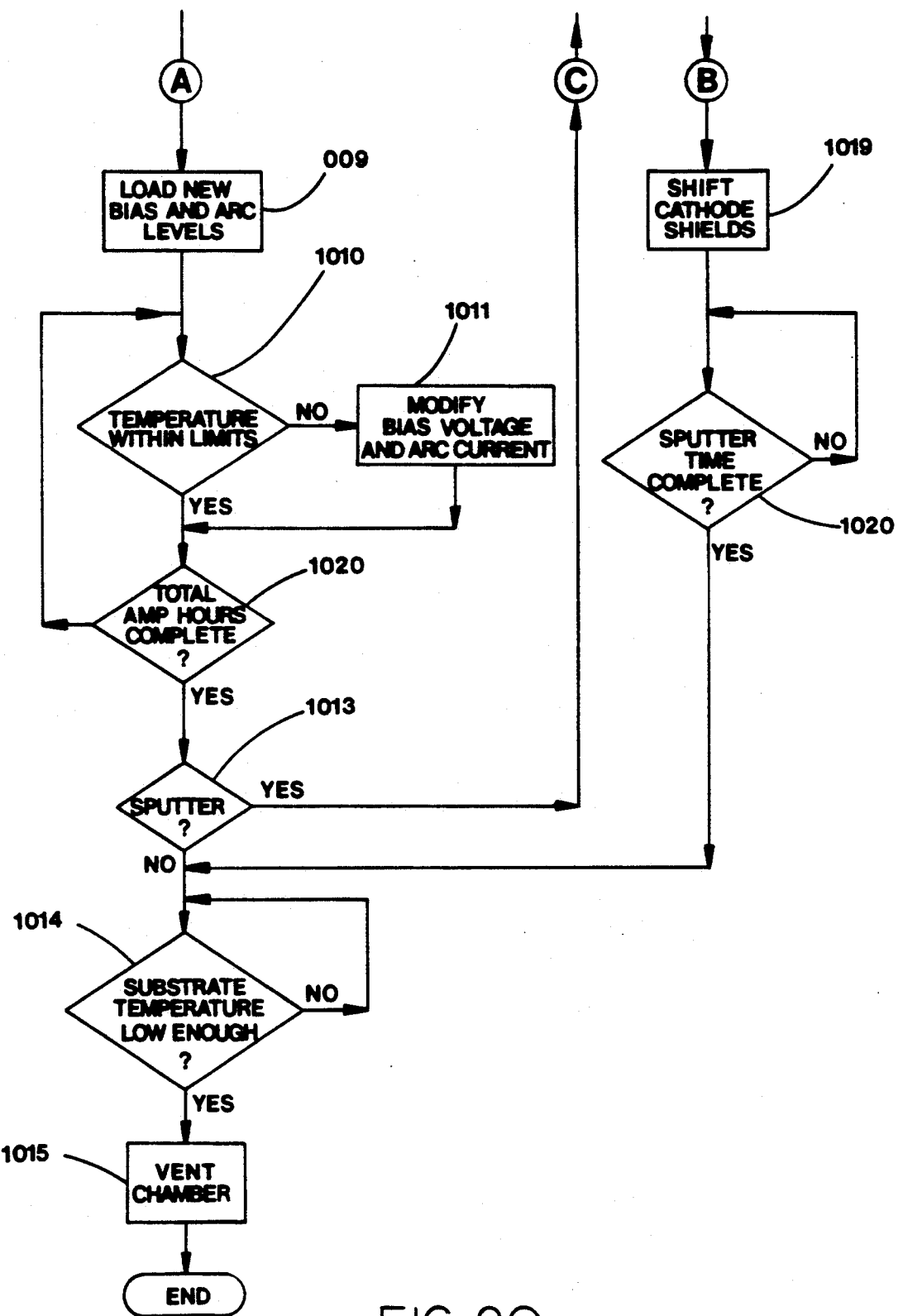
FIG. 20 Shows a continuation of FIG. 19.
Figure 21:
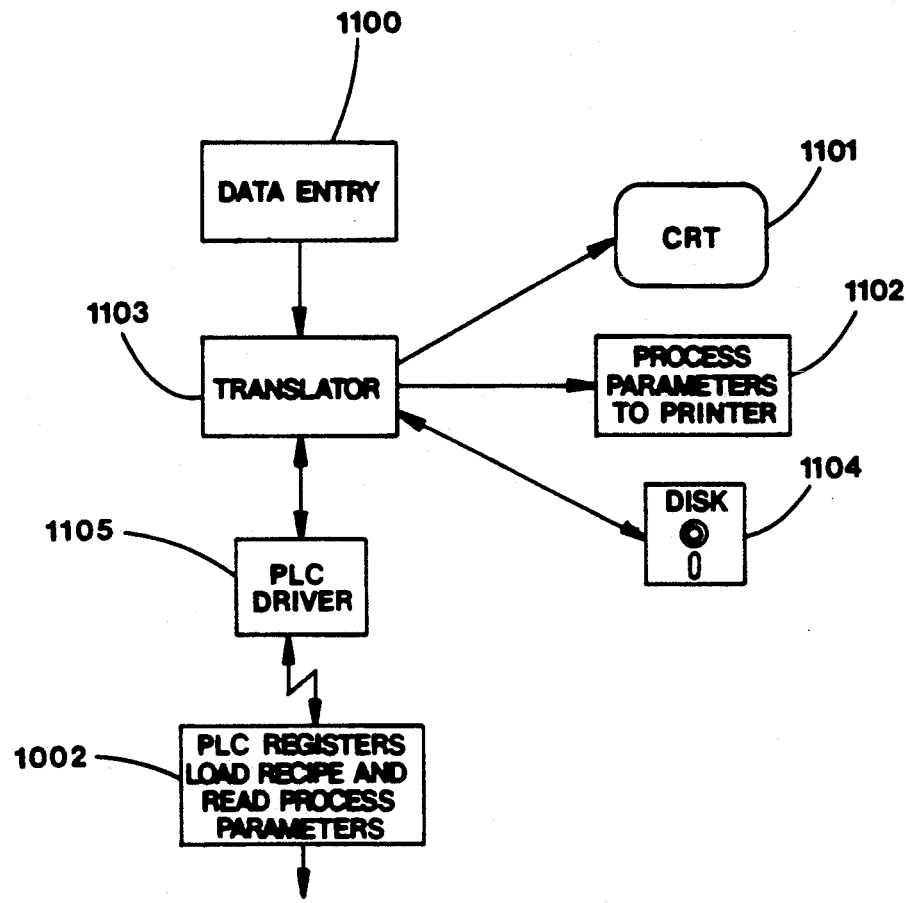
FIG. 21 Shows a software flow chart of the Personal computer (PC) logic.

Sequence numbers 1 through 7 show specific film characteristics produced by the CAPD process used in the Dual Coating System 400. Referring to FIG. 19, Block 1006 varies the ratios of two process gasses (FIG. 2, 33) which comprise acetylene as a source of carbon, and nitrogen. Suitably adjusting the ratios of carbon and nitrogen in the titanium and zirconium based films results in the excellent matching of luster and color film characteristics relative to gold as shown in FIG. 22. Thus in the typical Dual Coating System 400 operation a CAPD film is produced from the above noted FIG. 22 Sequence Numbers 1 through 7. Next a gold film may be applied using the sputtering process as shown in FIG. 1.

The preferred embodiment produces in sequence the above noted two films during a single vacuum cycle (FIG. 19 Block 1004). The adhesion of a second film consisting of gold on top of a CAPD deposited film taken from the selection in FIG. 22 Sequence Numbers 1 through 7 is commercially acceptable. A commercially acceptable adhesion is determined by using a Scotch Tape Pull test. This test results in no gold removal.

The ultimate purpose of the Dual Coating System 400 is to provide a single system which enables the direct coating of gold over TiN or ZrN without adhesion problems. In practice the gold wears off the substrate 8 (FIG. 1) thus exposing the TiN or ZrN film underneath. It is critical in the practice of the present invention that the substrate 8 maintain the same appearance as the gold film wears off. Thus the relative values in FIG. 22 Sequence Numbers 1 through 7 in relation to Sequence Numbers 8 and 9 are critical to the successful practice of the present invention.

Figure 16:
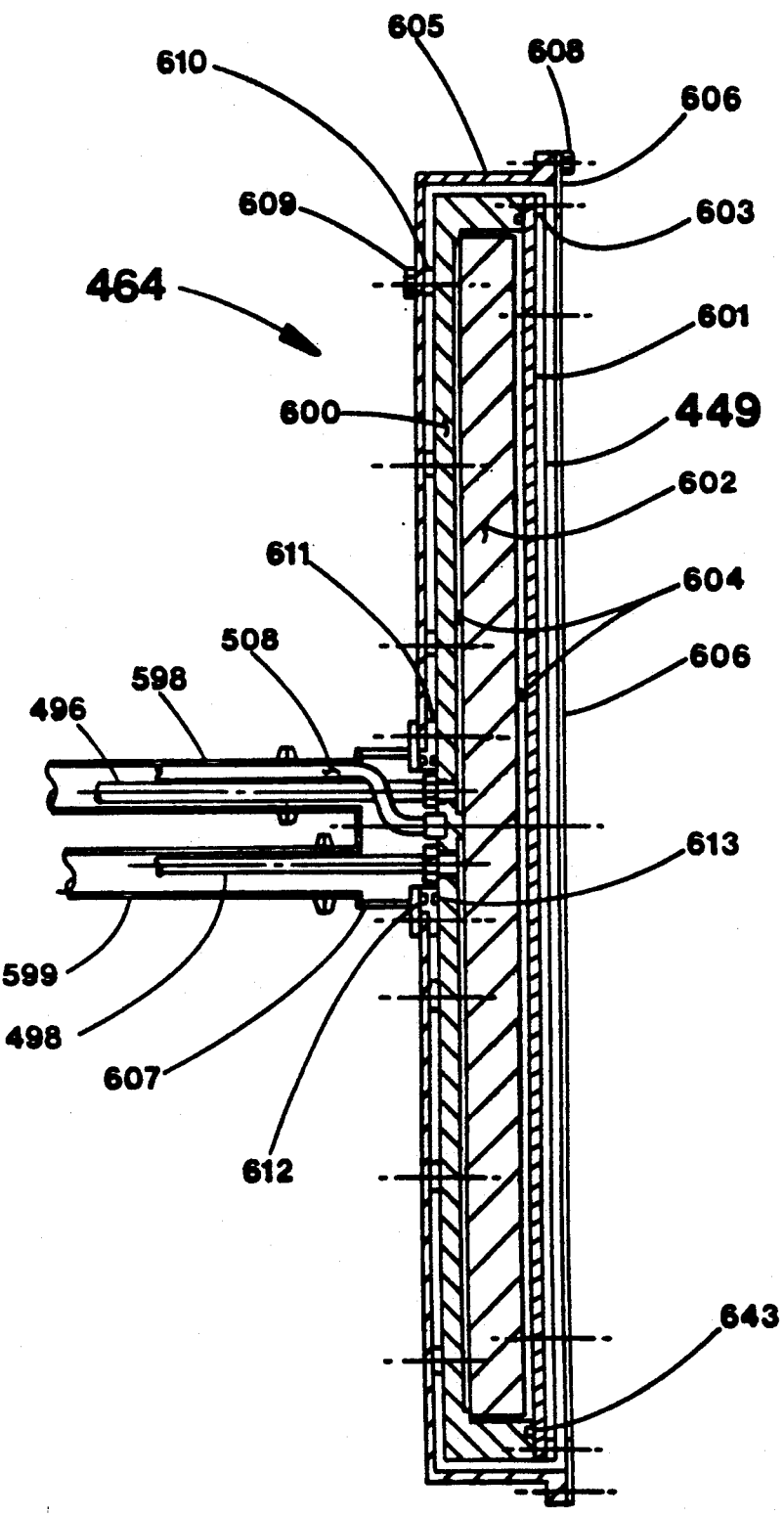
FIG. 16 Shows a longitudinal sectional view of the internally mounted sputtering cathode taken along line A—A of FIG. 15 which is coincident With the line B—B of FIG. 13.

FIG. 16 shows the internally mounted sputtering cathode 449 and corresponding anode 464 as seen in FIGS. 5, 8, 13 and 15. Internally mounted sputtering cathode 449 is comprised of cathode body 600, sputtering target 601, and magnet 602. Clamp 603 fastens the target 601 to the cathode body 600 and completes their electrical continuity. Lead 508 powers the internally mounted sputtering cathode 449. Cooling water inlet 496 supplies water to the cooling water passage 604 thereby cooling the target 601. Outlet 498 returns the cooling water to the cooling water supply manifold 432 (FIG. 4). O-ring 643 provides a waterproof seal between the target 601 and cathode body 600.

Corresponding sputtering anode 464 comprises an anode body 605, a dark space shield 606 and a utility hub 607. The dark space shield 606 restricts the plasma discharge to the target 601. The dark space shield is affixed to the anode body 605 by means of screws 608. The sputtering anode 464 is insulated from the internally mounted sputtering cathode 449 by means of insulators 610, Teflon bolts 609, and insulating ring 611. O-rings 612 and 613 maintain a vacuum seal between utility conduits 598 and 599 and the vacuum chamber 421.

Figure 17:
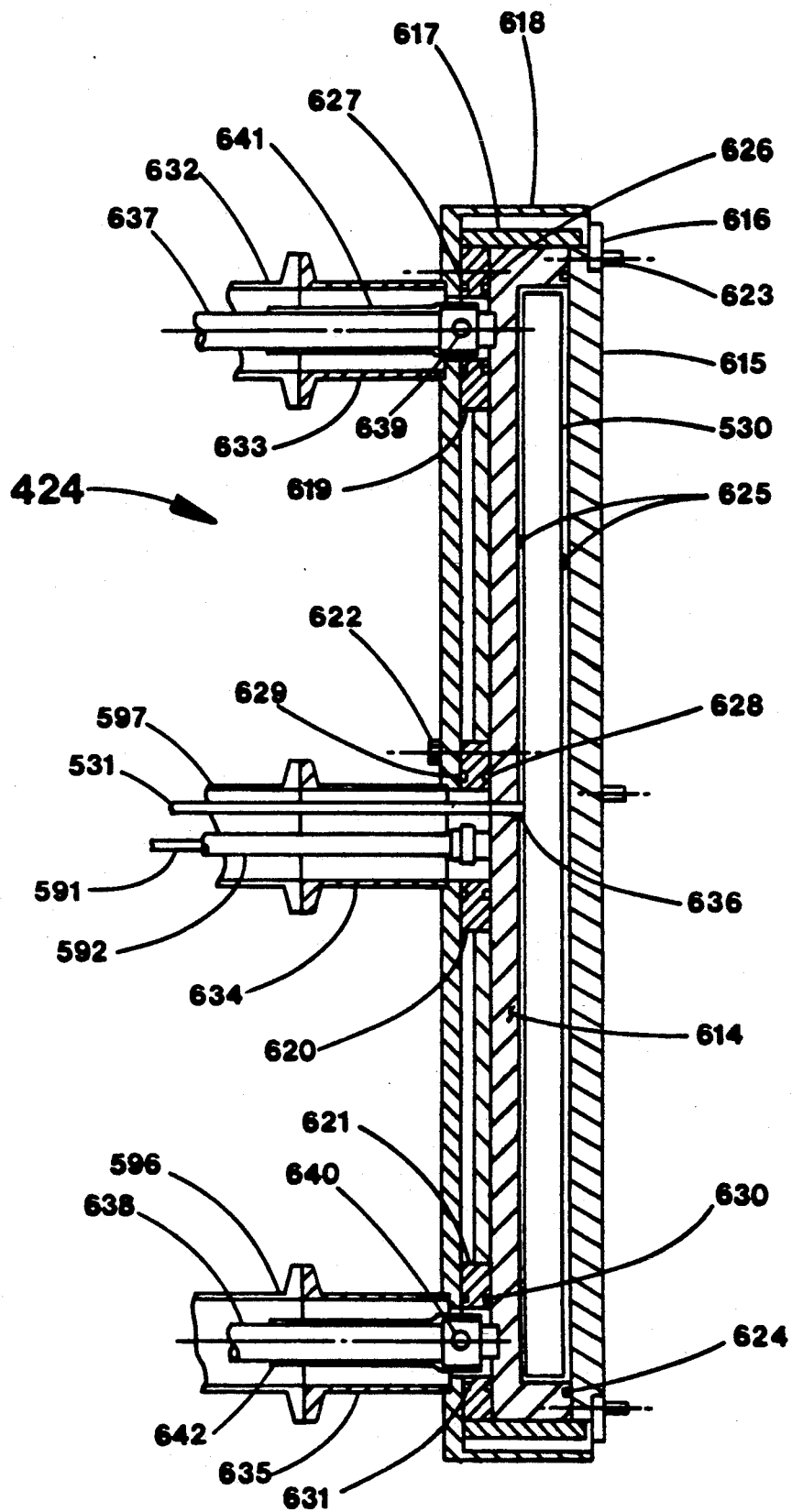
FIG. 17 Shows a longitudinal sectional view of the internally mounted CAPD cathode taken along line C—C of FIG. 15 which is coincident with line D—D of FIG. 13.

FIG. 17 shows the internally mounted CAPD cathode 424 as seen in FIGS. 4, 8, 13, and 15. Internally mounted CAPD cathode 424 is comprised of cathode body 614, CAPD target 615, target edge insulating strip 616, cathode body insulation 617, cathode shroud 618, and magnet 530. Cathode shroud 618 is insulated from the cathode body 614 by means of insulators 619, 620 and 621 and Teflon screws 622. Target edge insulating strip 616 is fastened to the CAPD target 615 by means of insulating fasteners 623. O-ring 624 provides a vacuum and water seal between the cathode body 614 and the CAPD target 615. Cooling water passage 625 is supplied with cooling water from inlet 591, thereby cooling the CAPD target 615. Outlet 592 returns the cooling water to the cooling water supply manifold 432. O-rings 626, 627, 628, 629, 630 and 631 maintain a vacuum seal between the cathode body 614 and cathode shroud 618 and the utility cables 596, 597 and 632. Utility cables 596, 597 and 632 connect to the cathode shroud 618 by means of connection hubs 633, 634 and 635.

Power to the electromagnet 530 is supplied by cable 531. Gasket 636 maintains a water tight seal between the electromagnet 530 and the cathode body 614. Power to the CAPD cathode 424 is supplied by lead 637 and 638 via connectors 639 and 640. Insulating sleeves 641 and 642 insulate connectors 639 and 640 from the cathode shroud 618.

Figure 18:
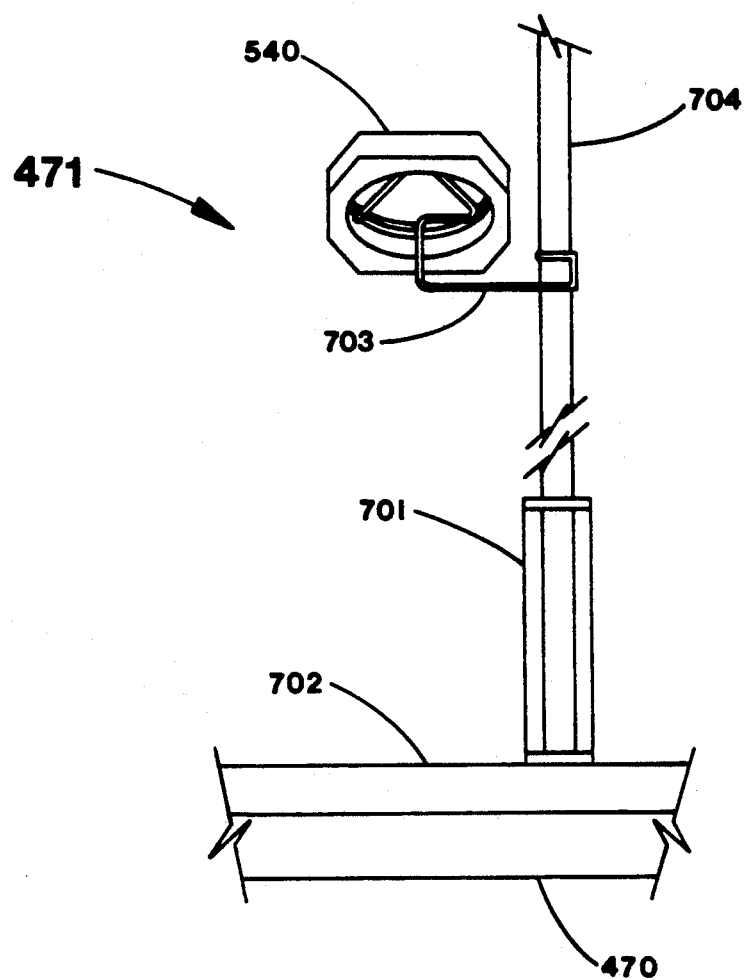
FIG. 18 Shows a front perspective view of a substrate clamp assembly for rings.

Referring next to FIG. 18, the substrate turntable 470 has a mounting surface 702 which supports the substrate mounting fixture 471. The substrate mounting fixture 471 further comprises a base column 701, and a variable length rod 704. A substrate clamp 703 is affixed to the variable length rod 704. Substrate clamp 703 has a flexible spring consistency. A triangular shape supports the substrate 540 in three spots. A ring, bracelet, earring or similar shaped substrate can be firmly secured with minimal contact against the substrate clamp 703.

Referring next to FIG. 3, the PLC 403 has the following basic hardware capabilities:
  Memory for storage of an operating system
  Memory for storage of a process program
  Logic Module process program execution
  Logic module for input/output control
The PLC software 404 has the following basic functional capabilities:
  An operating system for controlling the PLC hardware
  A process program ladder logic module Referring next to FIG. 19, block 1000 shows the PLC operating system starting up and checking hardware diagnostics to ensure a fully functional PLC exists before proceeding further.

Block 1001 shows the PLC reading all of the Dual Coating System 400 signal inputs including substrate temperature transmitter 545, cooling water safety switch 435 status, enclosure panels 414, 415, 416, 417, 418, 419 and 420 status, thermocouple sensor 518 measuring vacuum pressure, ion tube 519, pirani gauge sensor 517, valve control panel 551, drive motor 473 speed indicator/controller 553, manual/automatic selector switch 554, CAPD or sputtering process master start switch 556, selector switch 562, process termination switch 557, cooling water safety switch 435, enclosure safety switch 560, voltage and amperage indicators 564, 565, 566, and 567, CAPD cathode selector switches 568 and 569, substrate bias control module 572, internal sputtering power supply 410, door mounted sputtering cathode power control module 574, power indicators 853 and 854, capacitance manometer sensor 492, and the process gas controller 578.

Block 1002 shows the PLC 403 receiving variable recipe data from either the PC 405 or PLC input module 582.

Additionally the PLC 403 can send data to the PC 405 or to the PLC input module 582.

Block 1003 checks for a safe system including cooling water safety switch 435 status, enclosure panels 414, 415, 416, 417, 418, 419 and 420 all closed, and the thermocouple gauge indicator 548 which must show a vacuum exists before proceeding further. Therefore, the program logic first assures that the Dual Coating System 400 has adequate water flow and has all safety covers in place and has all doors and openings sealed thereby ensuring a secured vacuum chamber 421.

Block 1004 shows the logic for the sequencing of the mechanical pump 452, diffusion pump 451 and the cryogenic trap 489.

Block 1005 shows the logic for selecting whether to proceed with CAPD or sputtering by reading selector switch 562.

Block 1006 shows the logic for controlling the CAPD process gas by means of the process gas controller 578 which controls the mass flow control valves 427, and variable input process parameters from Block 1002. The PLC logic generates an error signal for pressure deviating from set point, and adjusts the mass flow control valves 427 accordingly.

Block 1007 shows the first process specific step for the CAPD process. This first step requires enabling the CAPD power supplies 408 and/or 852. Next the CAPD magnet 530 is enabled. Next the substrate bias power supply 409 is enabled. Next the substrate turntable 470 is activated. Next the substrate bias power supply 409 is controlled to the command voltage as received from Block 1002. Next the arc starter(s) 426, 465 ignite the arc(s).

The user has inputted a substrate temperature parameter into Block 1002. Now in Block 1008 the substrate temperature is brought up to setpoint by means of varying the CAPD power supplies 408 and 852, and the substrate bias power supply 409.

Blocks 1009, 1010, 1011, 1012 execute time versus power consumption and substrate temperature setpoint recipes which have been input into Block 1002.

Block 1012 terminates the CAPD process after a predetermined amp hour setpoint as received from Block 1002.

Block 1013 dictates whether to proceed with a sputtering process as predetermined from Block 1002.

Block 1014 proceeds to an orderly shutdown by allowing the internal chamber pipes 437 to cool the substrate 540 to a predetermined temperature as dictated by Block 1002.

Block 1015 executes either an atmospheric vent by opening vent valve 494, or by introducing process gas by means of process gas control valves 427.

The sputtering process is started in Block 1016 by introducing process gases by means of the process gas controller 578.

Next, Blocks 1017, 1018 move the sputtering cathode shields 513, 514 in front of the sputtering cathodes 464 and 463. Block 1017 proceeds to power the sputtering power supplies 410, 575 in order to sputter clean the sputtering target/cathodes 449 and 460. Time duration for sputter cleaning is dictated by Block 1002.

Next, Block 1019 removes the sputtering cathode shields 513 and 514 away from the sputtering target cathodes 449 and 460. The substrate turntable 470 is activated.

Next, Block 1020 sputters for a predetermined time and sputtering power supplies 410, 575 supply power output as determined by block 1002.

Sputtering terminates with Blocks 1014 and 1015.

Block 1100 shows the PC running executive software and receiving variable process recipes. Variable process recipes include all time, temperature, power, flow and pressure variables the user desires for his process. Block 1101 shows the CRT on the PC displaying the variable input recipes. An optional print output Block 1102 is shown. Alternatively the variable process recipes may be entered by means of the PLC input module 582.

Block 1103, shows the PC translating the variable input recipes from engineering units to PLC format data. Block 1104 shows the PC 405 storing and retrieving the variable input recipes.

Block 1105 controls all PC/PLC communications. Block 1106 shows the PLC 403 receiving the variable input recipes. Additionally, the PLC 403 can be commanded by the PC 405 to transmit measured process parameters for display and storage by the PC 405.

Variable process recipes can be inputted into Block 1100 concurrently with the execution of measured process parameter displays and storage in Blocks 1101, 1102 and 1104.

The best mode for practicing the above noted computer art utilizes a Texas Instruments Series 500 PLC Model 530 C-1102. The PC used herein is an IBM (or compatible) using a Microsoft operating system, MS-DOS, and EGA/VGA graphics. EGA/VGA graphics allow sixteen color displays, primitives and text. Asynchronous serial communications between the PLC and the PC utilize Texas Instruments Task Codes and assembly language routines.

The PLC ladder logic software is written using the Texas Instruments Tisoft Ladder Editor. The PC executive software is written in the "C" language using the Microsoft C compiler.

The executive software for the PC is menu driven thereby allowing the screen to prompt the user into entering variable recipes in engineering units. On line "help" prompts are available to the user as an exit from all screens. The executive software accepts all data in engineering units and converts all data to PLC machine readable data using "C" language subroutines.

The CRT Block 1101, printer Block 1102 and disk Block 1104 can receive and display or print or store all variable input process parameters in real time.

We claim:

1. A method for sequentially depositing discrete first and second thin film coatings on a substrate, comprising the steps of:
   a) placing the substrate in a chamber;
   b) evacuating the chamber;
   c) activating a CAPD target/cathode in the chamber;
   d) depositing one of said thin film coatings by CAPD on the substrate;
   e) deactivating said CAPD target/cathode;
   f) injecting a process gas into the chamber;
   g) activating a magnetron sputtering target/cathode in the chamber after said CAPD target/cathode is deactivated;
   h) creating a plasma discharge in the chamber; and
   i) depositing one of said thin film coatings by magnetron sputtering on the substrate.

2. The method for depositing multiple thin film coatings on a substrate in claim 1, further comprising the steps of:
   (i) cooling the chamber;
   (j) controlling all the foregoing process steps by means of a computer system.

3. The method for depositing multiple thin film coatings on a substrate in claim 1, further comprising the steps of:
   (k) shielding the CAPD droplets from the substrate.

4. The method for depositing multiple thin film coatings on a substrate in claim 1, further comprising the steps of:
   (l) controlling the thin CAPD film to be substantially the same luster and color as gold.

5. The method for depositing multiple thin film coatings on a substrate in claim 1, further comprising the steps of:
   (m) controlling the thin sputtering film to be firmly adhered to the thin CAPD film.

6. The method for depositing multiple thin film coatings on a substrate in claim 1, wherein the chamber vacuum is not broken between the CAPD deposition and the sputtering deposition except by injecting of the process gas.

* * * * *